United States Patent
Yasui et al.

(10) Patent No.: US 7,915,666 B2
(45) Date of Patent: Mar. 29, 2011

(54) NONVOLATILE SEMICONDUCTOR MEMORY DEVICES WITH CHARGE INJECTION CORNER

(75) Inventors: Kan Yasui, Kodaira (JP); Tetsuya Ishimaru, Tokyo (JP); Digh Hisamoto, Kokubunji (JP); Yasuhiro Shimamoto, Tokorozawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 227 days.

(21) Appl. No.: 12/124,143

(22) Filed: May 20, 2008

(65) Prior Publication Data

US 2008/0290401 A1 Nov. 27, 2008

(30) Foreign Application Priority Data

May 21, 2007 (JP) ................. 2007-134085

(51) Int. Cl.
*H01L 29/792* (2006.01)
(52) U.S. Cl. ............... 257/324; 257/317; 257/E21.679; 257/E29.309
(58) Field of Classification Search .................. 257/324, 257/317, E21.679
See application file for complete search history.

(56) References Cited

U.S. PATENT DOCUMENTS

| | | |
|---|---|---|
| 5,768,192 A | 6/1998 | Eitan |
| 6,317,360 B1 | 11/2001 | Kanamori |
| 6,940,757 B2 | 9/2005 | Kuo et al. |
| 7,045,848 B2 | 5/2006 | Shukuri |
| 7,170,785 B2 | 1/2007 | Yeh |
| 7,366,024 B2 | 4/2008 | Yeh |
| 7,442,986 B2 | 10/2008 | Yasui et al. |
| 7,544,988 B2 | 6/2009 | Shukuri |
| 2003/0042558 A1* | 3/2003 | Noguchi et al. ............... 257/406 |
| 2003/0227047 A1 | 12/2003 | Hsu et al. |
| 2004/0007734 A1* | 1/2004 | Kato et al. ................... 257/324 |
| 2004/0119107 A1 | 6/2004 | Hisamoto et al. |
| 2004/0245564 A1 | 12/2004 | Ogura et al. |
| 2005/0085039 A1* | 4/2005 | Yasui et al. .................. 438/257 |
| 2005/0098822 A1* | 5/2005 | Mathew et al. ............... 257/314 |
| 2009/0233431 A1 | 9/2009 | Shukuri |

FOREIGN PATENT DOCUMENTS

| | | |
|---|---|---|
| JP | 2003-309193 A | 10/2003 |
| JP | 2004-111749 A | 4/2004 |
| JP | 2004-186452 A | 7/2004 |
| JP | 2004-343014 A | 12/2004 |
| JP | 2005-123518 A | 5/2005 |
| JP | 2006-079802 A | 3/2006 |
| KR | 10-0369876 B1 | 1/2003 |
| KR | 10-2005-0037938 A | 4/2005 |

* cited by examiner

*Primary Examiner* — Hung Vu
*Assistant Examiner* — Vernon P Webb
(74) *Attorney, Agent, or Firm* — Miles & Stockbridge P.C.

(57) ABSTRACT

An erase method where a corner portion on which an electric field concentrates locally is provided on the memory gate electrode, and charges in the memory gate electrode are injected into a charge trap film in a gate dielectric with Fowler-Nordheim tunneling operation is used. Since current consumption at the time of erase can be reduced by the Fowler-Nordheim tunneling, a power supply circuit area of a memory module can be reduced. Since write disturb resistance can be improved, a memory array area can be reduced by adopting a simpler memory array configuration. Owing to both the effects, an area of the memory module can be largely reduced, so that manufacturing cost can be reduced. Further, since charge injection centers of write and erase coincide with each other, so that (program and erase) endurance is improved.

16 Claims, 29 Drawing Sheets

FIG. 5

|  | Vmg | Vs | Vcg | Vd | Vsub |
|---|---|---|---|---|---|
| READ [V] | 0 | 0 | 1.5 | 1 | 0 |
| WRITE [V] | 9 | 5 | 1 | 0.5 | 0 |
| ERASE [V] | −6 | 6 | 0 | OPEN | 0 |

FIG. 8
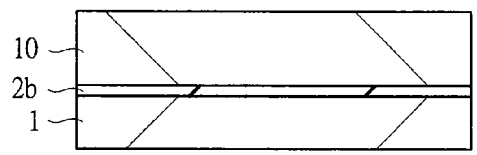 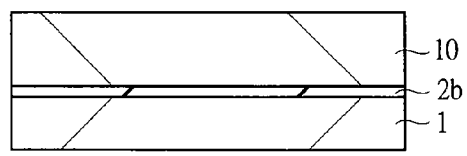
FIG. 9
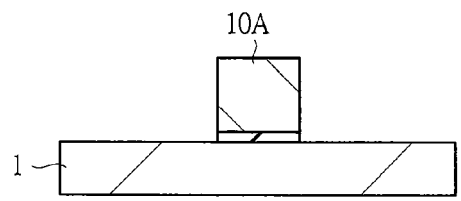 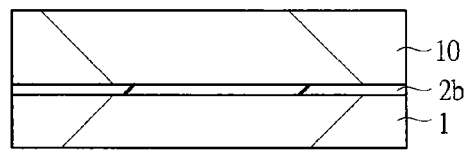
FIG. 10
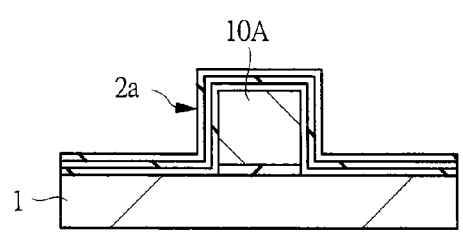 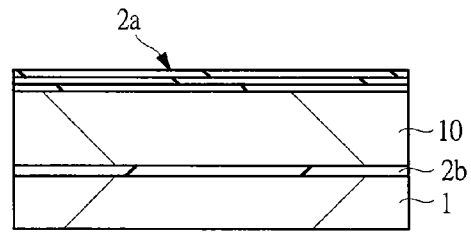

FIG. 28

|  | Vmg | Vs | Vcg | Vd | Vsub |
|---|---|---|---|---|---|
| READ [V] | 0 | 1.5 | 0 | 0.5 | 1.5 |
| WRITE [V] | −9 | −5 | −1 | −0.5 | 0 |
| ERASE [V] | −11 | OPEN | 0 | OPEN | 0 |

FIG. 30

|  | Vmg | Vs | Vcg | Vd | Vsub |
|---|---|---|---|---|---|
| READ [V] | 1.5 | 1.5 | 0 | 0.5 | 1.5 |
| WRITE [V] | −9 | −5 | −1 | −0.5 | 0 |
| ERASE [V] | −11 | OPEN | 0 | OPEN | 0 |

FIG. 46

|  | Vmg | Vs | Vcg | Vd | Vsub |
|---|---|---|---|---|---|
| READ [V] | 1.5 | 0 | 1.5 | 1 | 0 |
| WRITE [V] | 9 | 5 | 1 | 0.4 | 0 |
| ERASE [V] | 12 | OPEN | 0 | OPEN | 0 |

FIG. 47

|  | Vmg | Vs | Vcg | Vd | Vsub |
|---|---|---|---|---|---|
| READ [V] | 0 | 1.5 | 0 | 0.5 | 1.5 |
| WRITE [V] | −9 | −5 | −1 | −0.5 | 0 |
| ERASE1 [V] | −11 | OPEN | 0 | OPEN | 0 |
| ERASE2 [V] | 6 | −6 | 0 | OPEN | 0 |

NONVOLATILE SEMICONDUCTOR MEMORY DEVICES WITH CHARGE INJECTION CORNER

CROSS-REFERENCE TO RELATED APPLICATION

The present application claims priority from Japanese Patent Application No. JP 2007-134085 filed on May 21, 2007, the content of which is hereby incorporated by reference into this application.

TECHNICAL FIELD OF THE INVENTION

The present invention relates to a semiconductor device technique, and in particular to an effective technique applied to a semiconductor device having a nonvolatile memory cell including a charge trap film in a gate dielectric among electrically writable and erasable nonvolatile memories such as an EEPROM (Electrically Erasable Programmable Read Only Memory) or a flash memory.

BACKGROUND OF THE INVENTION

The electrically writable and erasable nonvolatile memory such as an EEPROM or a flash memory can rewrite a program on board, reduce its development term, and improve its development efficiency. Therefore, the nonvolatile memory can cope with various requirements, such as small-lot multi-product production, tuning for each customer, updating of a program after shipment.

In recent years, especially, needs for a microcomputer, which consist of a nonvolatile memory and a logic circuit such as a MPU (micro processing unit), has been increased. This is because a highly-functional semiconductor device can be realized by embedding a nonvolatile memory and a logic circuit on the same semiconductor substrate. Such an embedded-type semiconductor device is widely used as a built-in microcomputer in an industrial machine, a home appliance, an automobile-mounted device or the like. Generally, a program required by a microcomputer is stored in an embedded nonvolatile memory and it is read out at any time.

Since a nonvolatile memory is excellent in portability, impact-resistance, or the like, and electrically erasable in units of block, a demand for the nonvolatile memory has been increased in recent years as a storage device for a small-sized portable information device such as a portable type personal computer and a digital still camera. In order to satisfy such a demand, it is important to reduce bit cost by reduction of a memory cell area, and various memory cell structures have been proposed in order to realize the reduction.

Currently, a nonvolatile memory cell in a practical use uses a MOS (metal oxide semiconductor) type transistor for storage where a threshold voltage varies according to trap of charges. As a charge retention mechanism of the MOS type transistor for storage, there are a floating gate type where charges are trapped in electrically isolated conductive polysilicon and a MONOS type where charges are trapped in a dielectric film having charge-trapping property such as silicon nitride.

The floating gate type is widely used for a flash memory as a program storage in a mobile phone, or a large-capacity flash memory as a data storage and it has high retention characteristic. However, it becomes difficult to secure a capacitive coupling ratio required for potential control of a floating gate according to scaling, so that a structure is complicated. It is necessary to keep a thickness of oxide film surrounding the floating gate to approximately 8 nm or more in order to suppress leakage of retention charges, and scaling for a purpose of speed-up or high integration has been approaching limitation. Since charges are trapped in a conductor, even when only a single defect as a leakage path is present in an oxide film around the floating gate, retention life extremely lowers.

On the other hand, the MONOS type generally has a tendency that it is inferior to the floating gate in retention characteristic and the threshold voltage lowers with logarithm of time. Therefore, the MONOS type has been known from long ago, but practical use thereof is confined to only some products. However, since the MONOS type is a discrete trap memory, even if there are some leakage paths, almost all retained charges are prevented from being lost, so that the system is resistant to oxide film defect. Accordingly, the MONOS type has attracted attention according to advance of scaling in recent years again, because a thin oxide film with a thickness of 8 nm or less can be applied and it is suitable to scaling; extreme lowering of retention life does not occur due to defect generated at a low probability, so that reliability prediction is easy; a memory cell structure is simple and is easily embedded with a logic circuit portion; and the like.

SUMMARY OF THE INVENTION

For example, U.S. Pat. No. 5,768,192 (Patent Document 1) discloses an NROM structure as a simplest memory cell of memory cells of the above-mentioned MONOS type. FIG. 1 is a sectional view of NROM examined by the present inventors.

The NROM structure is a structure where a gate dielectric $2a$ of a MOS type transistor formed on a main surface of a semiconductor substrate 1 is replaced by an ONO film structure comprising dielectric films $2a1$, $2a2$, and $2a3$ (for example, silicon oxide, silicon nitride, and silicon oxide), where a channel hot electron injection (CHE) is used for write operation and hot hole injection by band to band tunneling (BTBT: band-to-band tunneling) is used for erase operation.

A gate electrode 3 is formed on the gate dielectric $2a$. The gate electrode 3 is composed of, for example, a polysilicon film, and a silicide layer 4 is formed thereon. A side wall spacer 5 is formed on a side surface of the gate electrode 3. Doped regions 6 and 7 are formed on the main surface of the semiconductor substrate 1 on both sides of the gate electrode 3 in a short direction. Silicide layers 4 are formed on the doped regions 6 and 7. The NROM structure is suitable for scaling or embedding with a logic circuit portion because formation process thereof is simple.

As a structure suitable for embedding with a logic circuit portion, different from the above structure, there is a split-gate type memory cell including a select MOS type transistor and a storage MOS type transistor. In this structure, since a source-side injection (SSI) excellent in injection efficiency can be adopted, speed-up of write operation and reduction of a power supply circuit area can be achieved, and since a transistor for memory cell selection and a transistor connected thereto can be configured with low voltage transistors having a small device area, an area of a peripheral circuit can be reduced, so that the split-gate type memory cell structure is suitable for application of embedding.

As a split-gate structure especially suitable for scaling, there is a structure where one of the MOS type transistors is formed on a side wall by utilizing self-align. In this case, since an alignment margin for photolithography is not required and a gate length of a transistor formed by self-align can be designed to the minimum resolution size or less of photolithography, a finer memory cell can be realized as compared with a structure that each of the two kinds of transistors is formed by utilizing a photo mask. Among them, for example, a memory cell where a self align gate side is formed in a MONOS structure, disclosed in Japanese Patent Application Laid-open Publication No. 2004-186452 (Patent Document 2: Japanese Patent Application No. 2002-352040) is suitable for embedding with a high-speed logic circuit. FIG. 2 is a sectional view of a memory cell examined by the present inventors where a self align gate side is formed to have a MONOS structure.

A select transistor and a memory transistor are arranged on a main surface of a semiconductor substrate 1 so as to be positioned adjacent to each other. The select transistor includes a gate dielectric 2b formed on the main surface of the semiconductor substrate 1 and a select gate electrode 10A formed thereon. The gate dielectric 2b is composed of a single layer film of oxide, and the select gate electrode 10A is composed of a polysilicon film.

A memory gate electrode 11 with a side wall structure is formed on the main surface of the semiconductor substrate 1 on a side wall side of the select gate electrode 10A via a gate dielectric 2a. The memory gate electrode 11 is composed of a polysilicon film.

In such a memory cell structure, since the select gate electrode 10A is first formed, a select transistor and a transistor of a logic circuit portion formed simultaneously and they can be formed in a state that quality of a semiconductor substrate interface is excellent. Since a transistor of a thin film gate for high-seed operation sensitive to interface quality can be first produced, performances of a transistor on the logic circuit portion and the select transistor to be embedded can be improved. Read operation of stored information can be performed by only the select transistor with a high performance, and transistors connected to the select transistor can be configured with thin film low voltage transistors, so that high speed read operation and reduction of a circuit area can be achieved.

FIG. 3 shows a memory array structure using the above-mentioned split-gate type MONOS memory cells. Each memory cell MC includes a memory gate electrode 11A and a select gate electrode 10A. A doped region 6 (hereinafter, also referred to as "source line SL (SL1 and SL2)) positioned adjacent to respective memory gate electrodes 11A of the memory cells MC adjacent to each other is arranged to be shared.

The source line SL is formed so as to extend in parallel to word lines CG (CG1 and CG2) and MG (MG1 and MG2). The word line CG is electrically connected to a plurality of the select gate electrodes 10A, while the word line MG is electrically connected to a plurality of the memory gate electrodes 11A. A bit line BL (BL1 and BL2) orthogonal to the word lines CG and MG is electrically connected to a doped region 7 (hereinafter, also referred to as "drain") adjacent to the select gate electrode 10A of each memory cell MC.

FIG. 4 is a layout plan view of the memory array configuration shown in FIG. 3. In the memory array, the plurality of word lines CG and MG extending in a vertical direction in FIG. 4 are disposed at desired intervals along a horizontal direction in FIG. 4. The word lines CG and MG are arranged adjacent to each other. The memory cell MC is formed on a region enclosed by a broken line. A hatching shows an isolation region 12.

Next, an operation of the memory shown in FIG. 3 will be explained with reference to FIGS. 5 to 7. FIG. 5 shows a typical voltage conditions at the time of operating the memory. FIG. 6 is a sectional view of the memory cell at the time of write operation, and FIG. 7 is a sectional view of the memory cell at the time of erase operation.

As shown in FIGS. 5 and 6, in the write operation, with the source-side injection (SSI), a select gate is made to be in weak inversion in a state that the memory gate electrode 11A and the source line SL have been applied with voltages of, for example, approximately 9 V and 5 V, respectively, and hot electrons are generated by an intense electric field generated between the select gate electrode 10A and the memory gate electrode 11A, so that the hot electrons are injected into the gate dielectric 2a (ONO film) of the memory transistor.

As shown in FIGS. 5 and 7, in the erase operation, the hot hole injection (BTBT) due to band to band tunneling is used. Hot holes due to band to band tunneling are generated by an intense electric field generated at an end portion of the doped region 6 on the source side when the memory gate electrode 11A is applied with a voltage of, for example, −6 V and the source line SL is applied with a voltage of, for example, approximately 6 V serving as reverse bias, so that the hot electrons are injected into the gate dielectric 2a (ONO film) of the memory transistor.

When written information is read out, determination is made based upon magnitude of current flowing in the drain by applying voltages of, for example, 0 V to the memory electrode 11A, for example, 1.5V to the select gate electrode 10A, and, for example, 1 V to the drain.

Besides the above-mentioned BTBT, in addition, as an erase method of the split-gate type MONOS memory, there is a method in which a high positive voltage of, for example, approximately 15 V is applied to the memory gate electrode to pull electrons from a whole area of the film. Since the erase method pulls electrons to the memory gate electrode side, a film configuration has a MNOS structure without a top oxide film or a MONOS structure having a thin top oxide film. The whole area pulling method requires a high voltage. Further, since electrons between the memory gate electrode 11A and the adjacent select gate electrode 10A are difficult to pull, there is such a case where an electric field is controlled by forming a taper on a side wall as disclosed in, for example, Japanese Patent Application Laid-open Publication No. 2004-111749 (Patent Document 3). As a system for performing electric field control by taper formation, there is also a method where charges are injected from a bottom oxide film, disclosed in U.S. Pat. No. 6,940,757 (Patent Document 4), but such a problem arises that it is difficult to achieve speed-up, which is greatly different from the split-gate type including a standard memory cell structure and a standard memory array configuration, in addition to degradation of the bottom oxide film, which largely influence characteristic.

A fabrication process of the split-gate type MONOS memory cell is excellent in consistency with a standard CMOS process and is suitable for being mounted on a microcomputer or the like. A fabrication process flow of a semiconductor device in which a split-gate type MONOS memory cell and CMOS logic process are embedded, which is examined by the present inventors, is illustrated in FIGS. 8 to 16. A cross-section of a principal part of a memory region (memory array) are shown on left sides of respective figures and a cross-section of a principal part of a logic region forming CMOS are shown on right sides thereof.

FIG. 8 shows a stage where a gate dielectric 2b composed of silicon oxide and a gate electrode material 10 composed of a polysilicon film are formed on a main surface of a semiconductor substrate 1 composed of silicon (Si) single crystal. A gate dielectric 2b is shared with a select transistor in the memory region and a transistor in the logic portion. An isolation structure is formed in a previous stage (not shown) with an ordinary method.

Subsequently, FIG. 9 shows a stage where a gate electrode 10A of the select transistor in the memory region is formed by photolithography and dry etching. In this stage, the gate electrode material 10 in the logic region is not patterned.

Subsequently, FIG. 10 shows a stage where an ONO film (gate dielectric 2a) of a three-layered structure of a $SiO_2$ film, a $Si_3N_4$ film, and a $SiO_2$ film is deposited. Next, FIG. 11 shows a stage where a memory gate electrode 11A is formed by depositing amorphous silicon doped with dopant as second electrode material for making memory gate electrode material, and etching back the amorphous silicon by dry-etching to leave an amorphous silicon film, as side walls, on only both side walls of the select gate electrode 10A. Subsequently, FIG. 12 shows a stage where the memory gate electrode 11A is formed on only one side of the select gate electrode 10A by removing unnecessary memory gate electrode 11A on the other side from the memory gate electrodes 11A initially positioned on the both side of the select gate electrode 10A by dry-etching and further by removing the gate dielectric 2a under the unnecessary memory gate electrode 11A.

Next, as shown in FIG. 13, a gate electrode 10B is then formed in the logic region by patterning the gate electrode material 10 in the logic region using photolithography and dry-etching. Subsequently, lightly doped n-type regions 6a and 7a are formed by introducing dopant in the memory region and lightly doped regions 15a and 15a are formed by introducing dopant in the logic region. Subsequently, after a dielectric film made of $SiO_2$ is deposited on the main surface of the semiconductor substrate 1, side walls 5 are formed on side of the select gate electrode 10A and the memory gate electrode 11A in the memory region and on each side of gate electrode 10B in the logic region by etching back the dielectric film, as shown in FIG. 14. Doped regions 6 and 7 for a source and drain are then formed by introducing dopant into the memory region to form highly doped n-type regions 6b and 7b. Doped regions 15 for a source and drain are then formed by introducing dopant into the logic region to form highly doped regions 15b and 15b.

Next, as shown in FIG. 15, by forming silicide layers 4 composed of, for example, cobalt silicide on upper surfaces of the select gate electrode 10A, the gate electrode 10B, the memory gate electrode 11A, and the highly doped regions 6b, 7b, and 15b, reduction in resistances of the respective portions is achieved. Thereafter, as shown in FIG. 16, after a first dielectric layer 16 is deposited on the main surface of the semiconductor substrate 1, an upper face thereof is planarized and contact holes 17 are formed. Thereafter, an ordinary metallization process for forming approximately three to six layers is performed, although explanation thereof is omitted.

Now, both the MONOS memory cell with the above-mentioned NROM structure and the MONOS memory cell with the split-gate structure are suitable for scaling, and are excellent in affinity with the standard CMOS process. However, it has been found by the inventors that these memory cells include the following problems.

One of the problems lies in that, since the hot hole injection with band to band tunneling (BTBT) is used for the erase operation, current consumption during the erase operation tends to increase. As an example shown in FIG. 7, voltages of 6 V and −6 V are respectively applied to the doped region 6 and the memory gate electrode 11 and some of holes generated due to band to band tunneling are accelerated to be injected into a direction of the memory gate electrode. However, most of the holes flow into the semiconductor substrate 1 and become a wasteful current. The value of the wasteful current reaches several μA/cell, which results in requirement for a large power source for erase depending on the number of simultaneous erase bits. Increase in an erase voltage for write level improvement for improving retention characteristic or improving erase rate causes increase of an erase current. Accordingly, high performance of the system causes growth of a size of a charge pump circuit, so that a circuit area of a memory module is increased.

The second problem is such a problem that since there is much leakage current from a junction, disturb resistance is poor. Hot carriers generated by channel hot electron (CHE) or SSI are used for write operation in both the NROM structure and the split-gate structure MONOS. When the leakage current from a junction is injected with hot carriers, a disturb mode causing write error appears. Relaxation of the junction is effective to reduce the leakage current. However, the junction is required to be somewhat steep in order to generate band to band tunneling, and it is difficult to satisfy both requirements as long as erase operation of the BTBT is used. As a result, in order to compensate for shortage of the disturb resistance, a measure in which a division unit of the memory array is designed to be finer to shorten the disturb time, is required, so that a circuit area of the memory module is increased.

An object of the present invention is to provide a technique where an area of a nonvolatile memory region can be reduced in a semiconductor device having a nonvolatile memory cell including a charge trap film in a gate dielectric.

The above-mentioned and other objects and a novel feature of the present invention will be apparent from the description of the present specification and the accompanying drawings.

SUMMARY OF THE INVENTION

A representative one of the inventions disclosed in the present application will be briefly explained below.

That is, according to an aspect of the present invention, in a semiconductor device including a nonvolatile memory cell containing a charge trap film in a gate dielectric, a portion with a locally changed physical shape is provided at a gate electrode on the gate dielectric, and charges are injected into the charge trap film with Fowler-Nordheim tunneling by applying a proper potential to the portion with a locally changed physical shape, thereby erasing data.

An effect obtained by the representative one of the inventions disclosed in the present application will be briefly explained below.

That is, in the semiconductor device including a nonvolatile memory cell containing a charge trap film in a gate dielectric, a portion with a locally changed physical shape is provided at a gate electrode on the gate dielectric, and charges are injected into the charge trap film with Fowler-Nordheim tunneling by applying a proper potential to the portion with a locally changed physical shape, thereby erasing data, so that a current flowing during erase operation can be reduced to such an extent that the current can be neglected. Further, since the characteristic thereof does not depend on a junction, the junction can be relaxed, so that an area of the non-volatile memory region can be reduced.

BRIEF DESCRIPTIONS OF THE DRAWINGS

FIG. 5 is an explanatory table of typical voltage conditions at an operation time of the memory shown in FIG. 3;

FIG. 8 is a sectional view of a main portion during manufacturing step of a semiconductor device embedded with a split-gate type MONOS memory cell and a CMOS logic process examined by the present inventors;

FIG. 9 is a sectional view of the main portion during a manufacturing step of the semiconductor device continued from FIG. 8;

FIG. 10 is a sectional view of the main portion during a manufacturing step of the semiconductor device continued from FIG. 9;

FIG. 28 is an explanatory table collectively showing voltages in a read state, a write state, and an erase state of a semiconductor device according to an embodiment of the present invention;

FIG. 30 is an explanatory table collectively showing voltages in a read state, a write state, and an erase state of the semiconductor device according to the second embodiment;

FIG. 46 is an explanatory table collectively showing voltages in a read state, a write state, and an erase state of a semiconductor device according to another embodiment (twelfth embodiment) of the present invention;

FIG. 47 is an explanatory table collectively showing voltages in a read state, a write state, and an erase state of a semiconductor device according to another embodiment (fifteenth embodiment) of the present invention;

DESCRIPTIONS OF THE PREFERRED EMBODIMENTS

Figure 1:
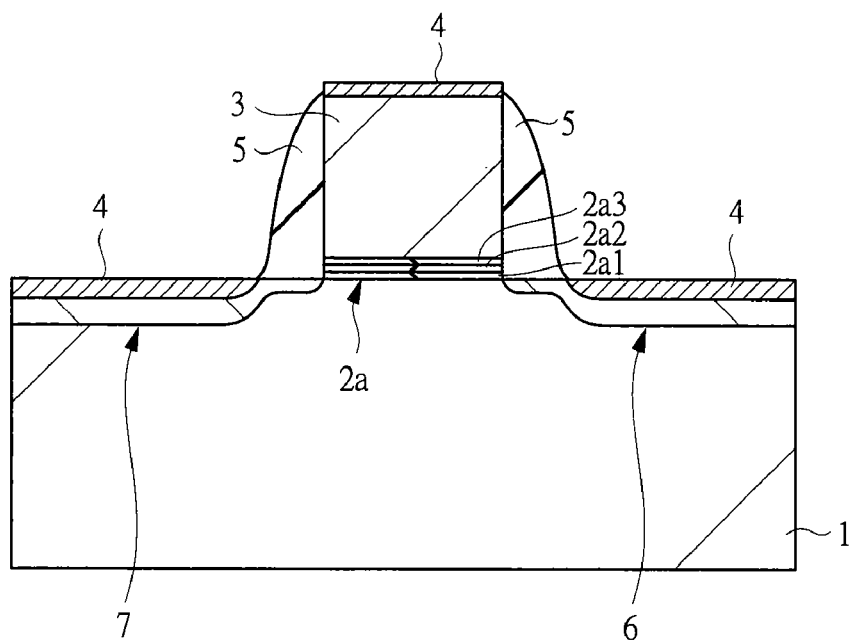
FIG. 1 is a sectional view of NROM examined by the present inventors.

The above-mentioned problem is due to use of the hot hole injection with band to band tunneling (BTBT) for the erase operation. The problem can be solved by replacing the BTBT with an erase method where erase current is small and a steep junction is not required.

As the solving means, there is a method using Fowler-Nordheim tunneling for the erase operation. When the Fowler-Nordheim tunneling is adopted, an amount of a current flowing during operation is small to such an extent that it can be neglected, and a junction can be relaxed because characteristic of the Fowler-Nordheim tunneling does not depend on the junction. On the other hand, a high electric field is required in order to cause Fowler-Nordheim tunneling operation, and such a high voltage as 15 to 20 V is required when a required film thickness is considered from a flat film structure and retention characteristic viewpoints. On the contrary, such a high voltage may cause increase of an area of a power supply circuit. In order to generate Fowler-Nordheim tunneling operation even in a low voltage, a shape generating high electric field can be produced utilizing such a property that the electric field is concentrated to a portion with a locally changed physical shape. As a method for producing such a shape, a configuration in which a projection portion is formed on a gate electrode and a manufacturing process thereof can be used.

Specifically, first, in case of the split-gate structure, a corner portion of a memory gate electrode is utilized. When a proper potential is applied to a corner portion of a memory gate electrode contacting with a dielectric film of an adjacent control gate electrode, charges are injected by Fowler-Nordheim tunneling. The corner portion may be formed to have an acute angle in order to increase an injection amount of charges. Injection of charges with reverse polarity for cancelling charges injected at the corner portion can be performed using a source-side injection (SSI). Accordingly, write and erase operations can be realized.

In case of the NROM structure, Fowler-Nordheim tunneling operation can be caused by unevenly oxidizing side faces of the memory gate electrode to form the corner portion of the memory gate electrode to have an acute angle.

There is a plurality of technical choices regarding a relation between an acute angle formation process of a corner portion of a memory gate electrode and a potential required for charge injection. Possible combinations and effects will be described below.

In the embodiments described below, the invention will be described in a plurality of embodiments when required as a matter of convenience. However, these embodiments are not irrelevant to each other unless otherwise stated, and the one relates to the entire or a part of the other as a modification example, details, or a supplementary explanation thereof. In all figures for explaining the embodiments, parts or portions having the same function are denoted by the same reference numerals and repetitive explanation thereof is omitted if at all possible. The embodiments of the present invention will be explained in detail below with reference to the drawings.

First Embodiment

Figure 2:
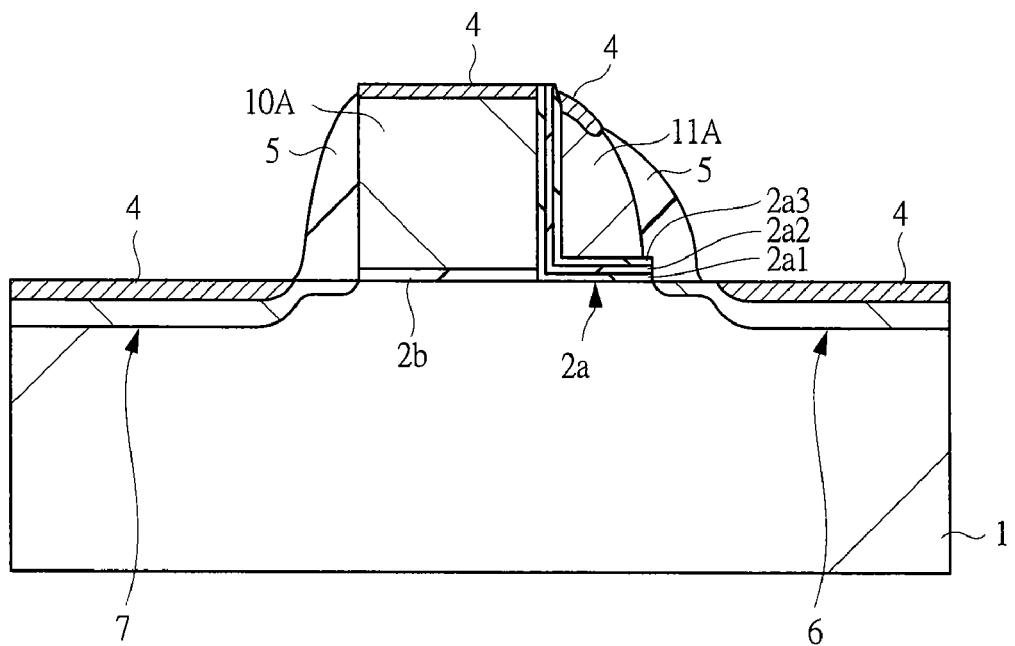
FIG. 2 is a sectional view of a memory cell examined by the present inventor(s) and having a MONOS structure on a self align gate side.
Figure 3:
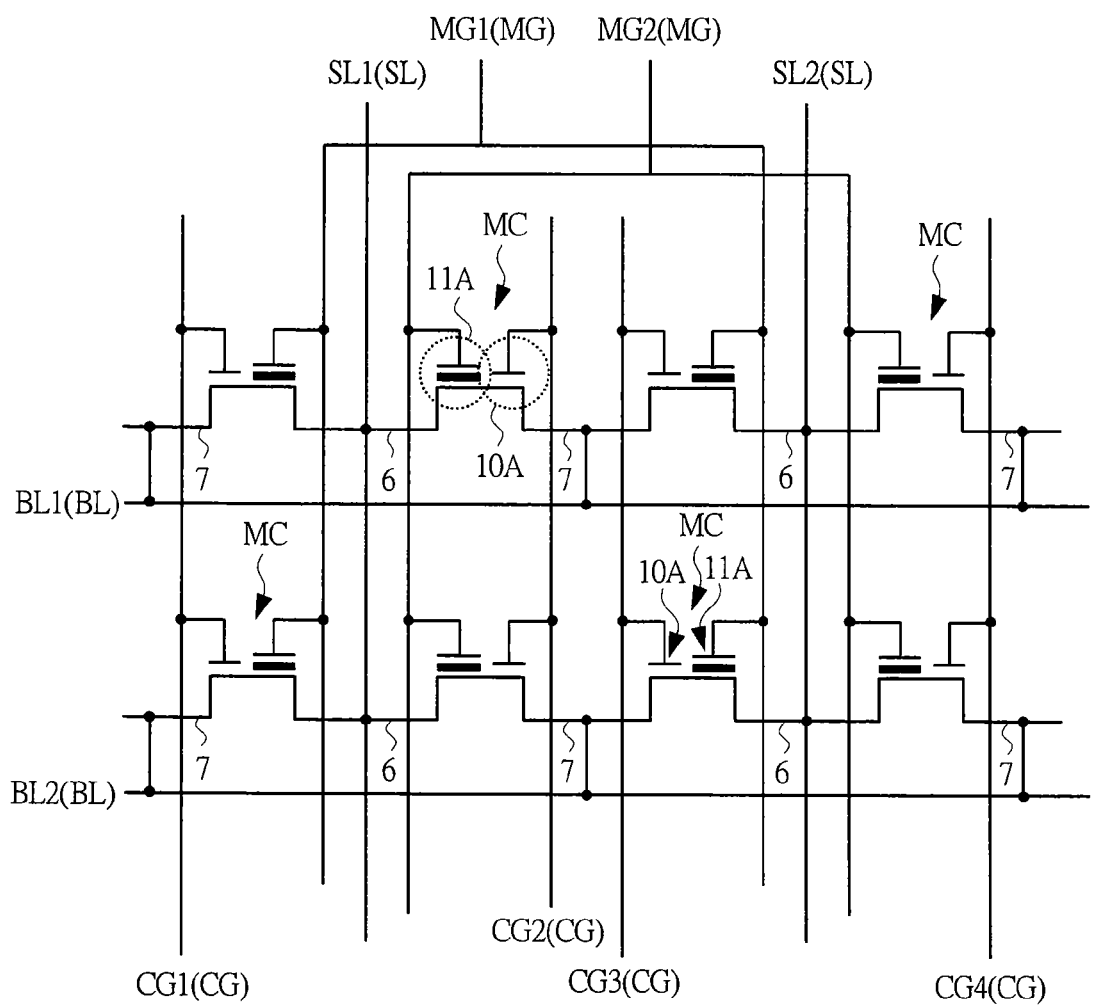
FIG. 3 is a circuit diagram of a memory array configuration using a split-gate type MONOS memory cell.
Figure 4:
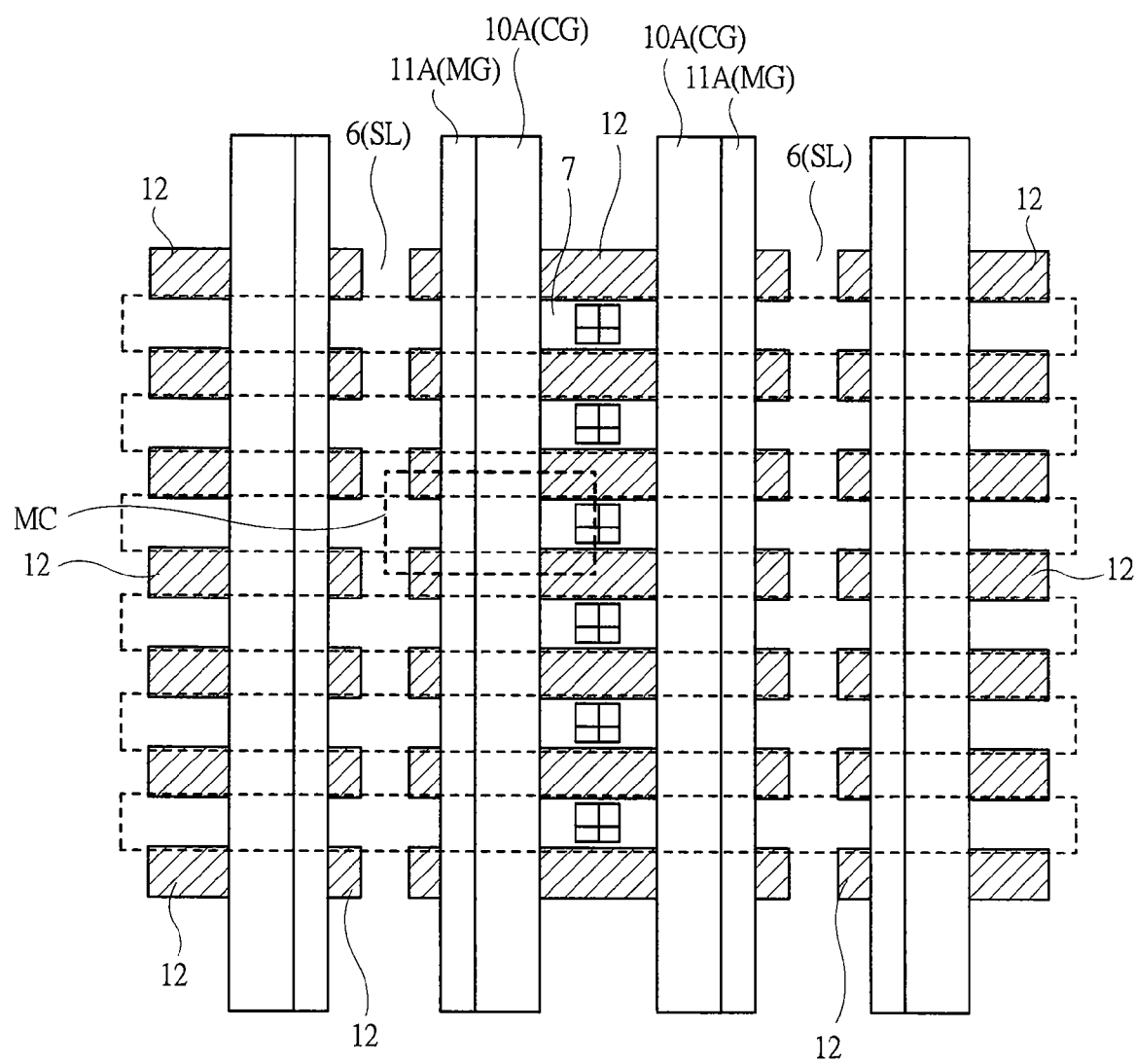
FIG. 4 is a layout plan view of the memory array configuration shown in FIG. 3.
Figure 6:
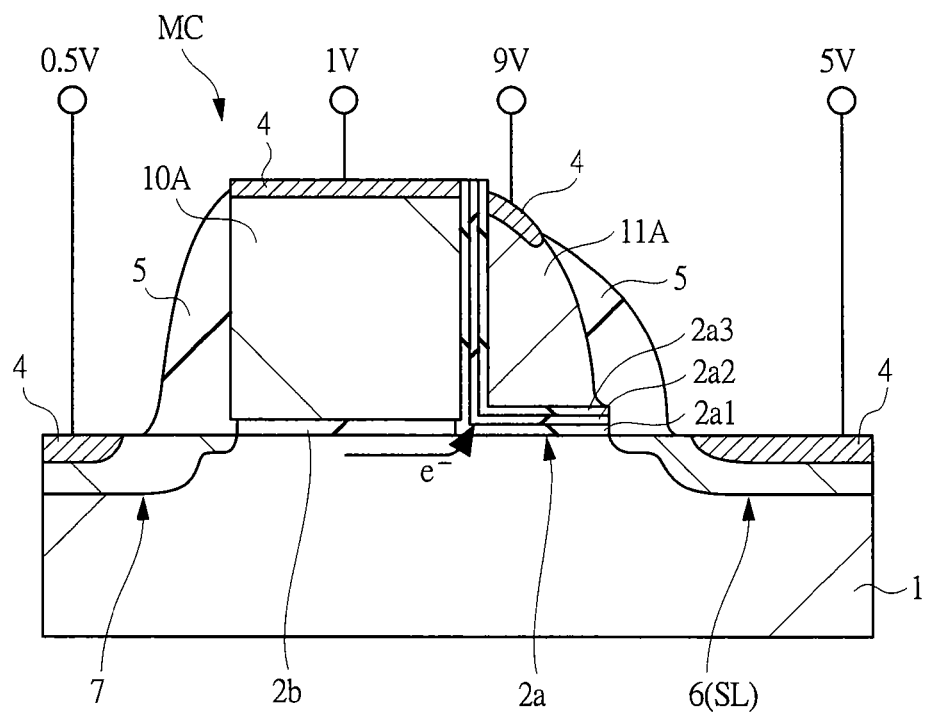
FIG. 6 is a sectional view of the memory cell at a write operation time of the memory shown in FIG. 3.
Figure 7:
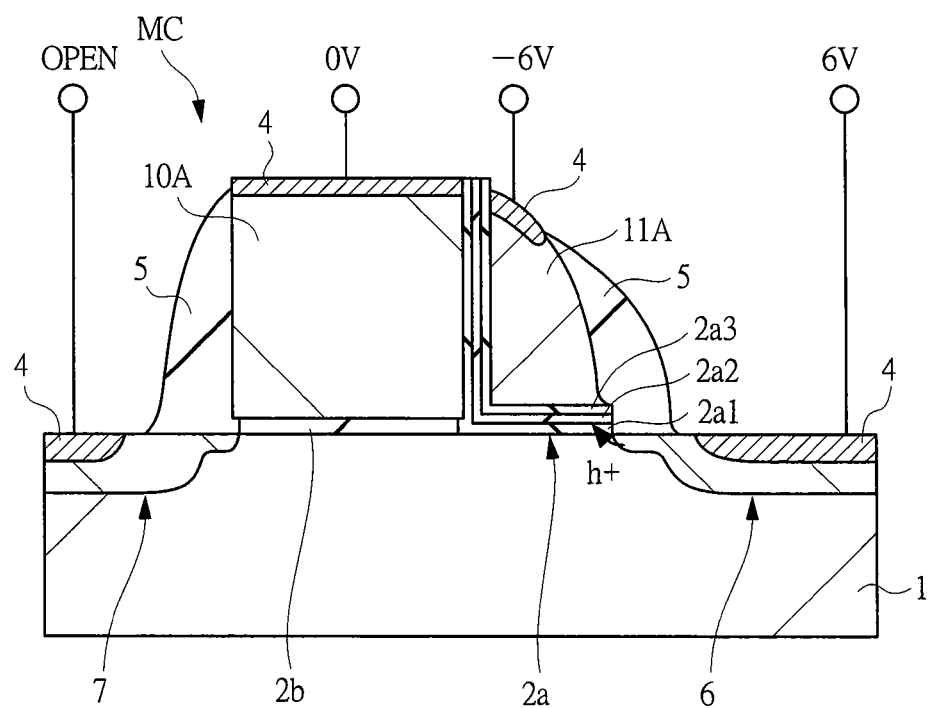
FIG. 7 is a sectional view of the memory cell at an erase operation time of the memory shown in FIG. 3.
Figure 11:
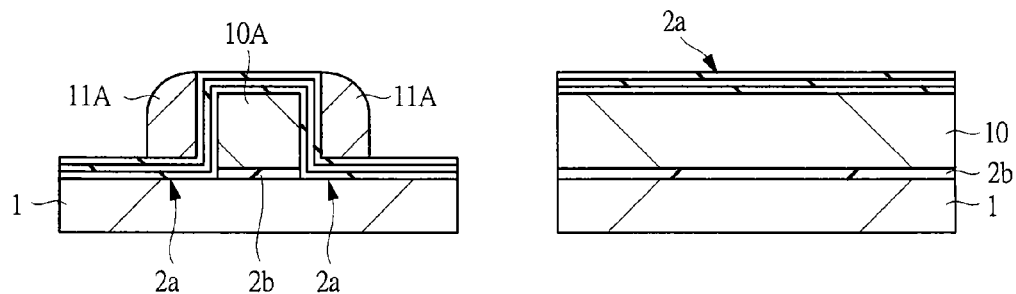
FIG. 11 is a sectional view of the main portion during a manufacturing step of the semiconductor device continued from FIG. 10.
Figure 12:
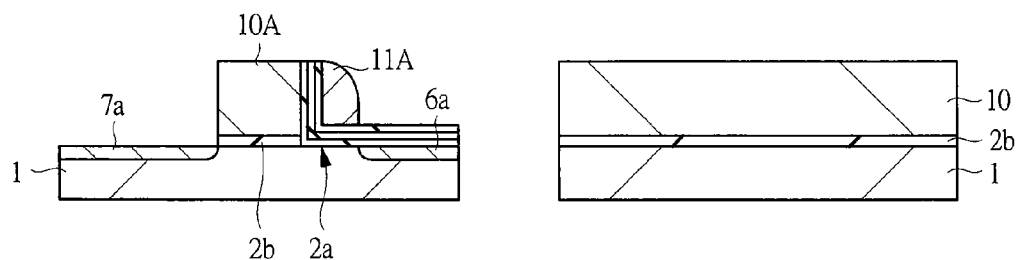
FIG. 12 is a sectional view of the main portion during a manufacturing step of the semiconductor device continued from FIG. 11.
Figure 13:
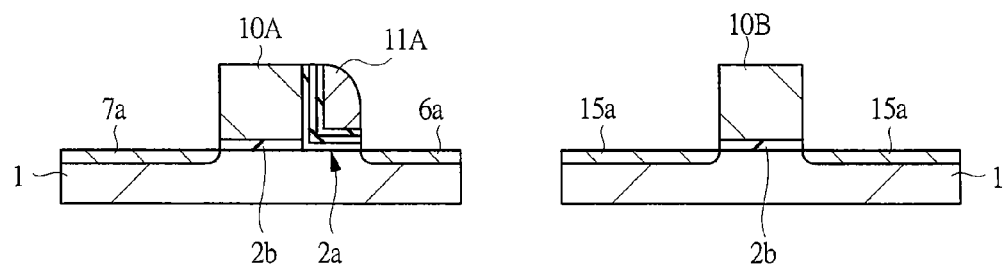
FIG. 13 is a sectional view of the main portion during a manufacturing step of the semiconductor device continued from FIG. 12.
Figure 14:
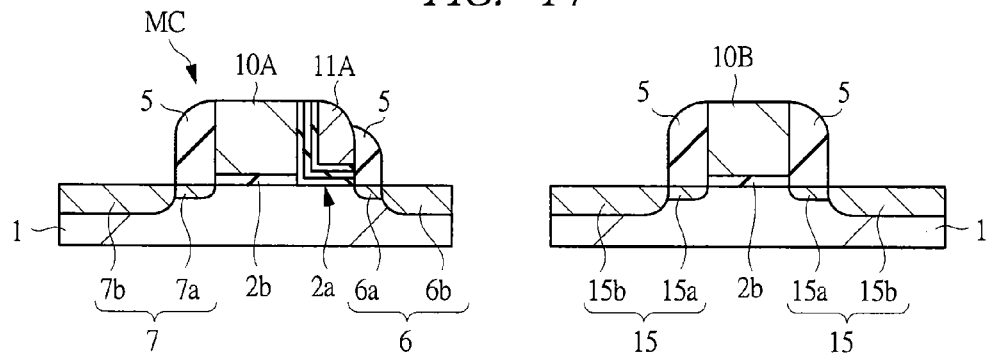
FIG. 14 is a sectional view of the main portion during a manufacturing step of the semiconductor device continued from FIG. 13.
Figure 15:
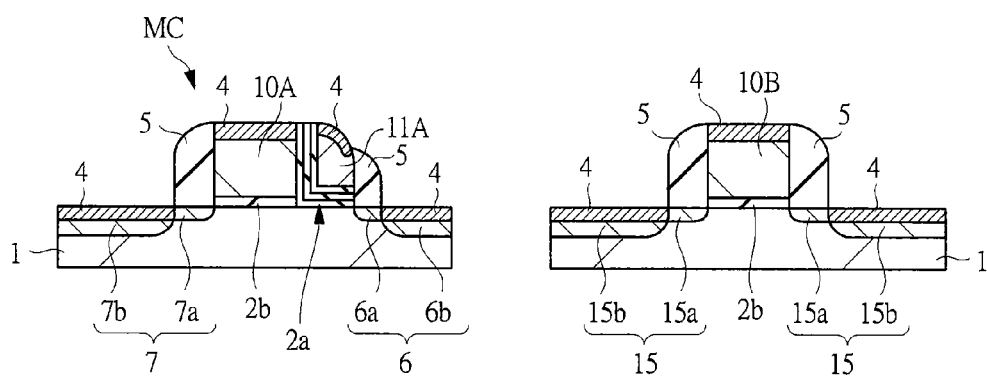
FIG. 15 is a sectional view of the main portion during a manufacturing step of the semiconductor device continued from FIG. 14.
Figure 16:
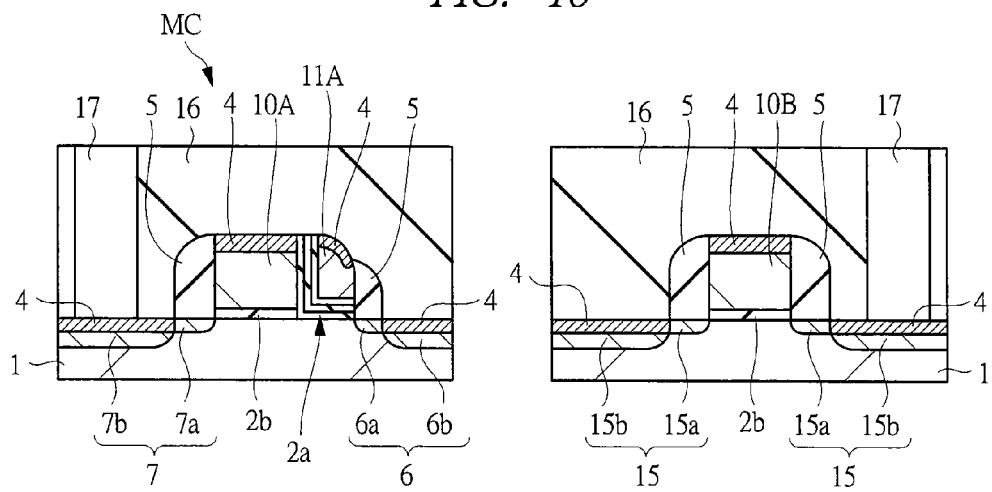
FIG. 16 is a sectional view of the main portion during a manufacturing step of the semiconductor device continued from FIG. 15.

A semiconductor device according to a first embodiment is a semiconductor device including a logic operation circuit typified by, for example, a microcomputer and a nonvolatile memory circuit provided on one and the same semiconductor substrate. A memory cell (a nonvolatile memory cell) in the nonvolatile memory circuit of the semiconductor device according to the first embodiment is a MONOS memory having a self align split-gate structure. A basic configuration of a memory cell is as explained with reference to FIG. 2 and the like. A memory array configuration is shown in FIG. 3 and a layout of a memory cell MC is shown in FIG. 4. A portion enclosed by a broken line in FIG. 4 corresponds to one memory cell MC. Arrangement of select gate electrodes 10A and memory gate electrodes 11A of memory cells MC adjacent to each other always takes a symmetrical appearance. Incidentally, regarding the above-mentioned terms, here, the term "memory gate electrode" indicates a gate electrode of a MOS transistor having a film (ONO film, charge trap film) trapping charges as a dielectric film. The term "select gate electrode" indicates a gate electrode of a MOS transistor functioning to select this electrode at the time of read.

A manufacturing method of a semiconductor device according to the present embodiment will be first explained with reference to FIGS. 17 to 22. FIGS. 17 to 22 show sectional views of a main portion of a semiconductor device according to the embodiment during manufacturing step thereof. In FIGS. 17 to 22, main portion sections of a memory region (memory array) are shown on the left side, and main portion sections of a logic region forming a CMOS (complementary MOS) are shown on the right side. Since the manufacturing method of the semiconductor device according to the embodiment conforms to the manufacturing flow of the semiconductor device explained with reference to FIGS. 8 to 16, different part will be mainly explained. Incidentally, in manufacture of a semiconductor device, for example, a process rule of 90 nm node is adopted.

Figure 17:
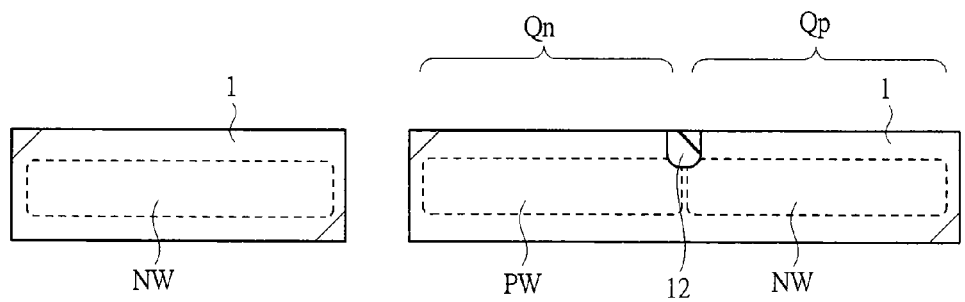
FIG. 17 is a sectional view of a main portion during a manufacturing step of a semiconductor device according to an embodiment of the present invention.

As shown in FIG. 17, after an isolation region 12 such as a trench type isolation region is formed on a main surface of the semiconductor substrate 1 using a general process, in the semiconductor substrate 1 composed of, for example, p type silicon (Si) single crystal, a p-type well PW is formed by performing ion implantation of, for example, boron (B) of p type dopant in an nMOS region Qn and an n-type well NW is formed by performing ion implantation of, for example, phosphorus (P) of n type dopant in a pMOS region Qp and a memory region. Thereafter, after channel ion implantation of a high voltage MOS region with a thick film and formation of a gate oxide film are performed, channel ion implantation for threshold voltage adjustment of the logic region and the memory region is performed.

Figure 18:
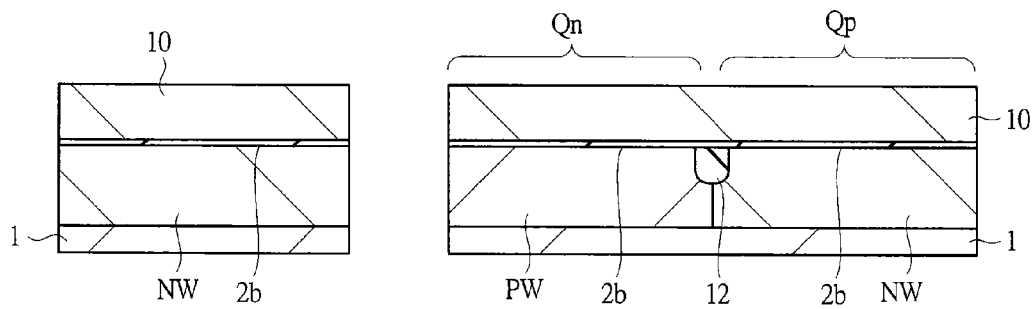
FIG. 18 is a sectional view of the main portion during a manufacturing step of the semiconductor device continued from FIG. 17.

Subsequently, as shown in FIG. 18, a thermal oxidation film with a thickness of 2 nm serving as a gate dielectric 2b common to a select transistor and a transistor in the logic region is formed at a temperature of, for example, 800° C., and gate electrode material 10 with a thickness of 220 nm composed of, for example, a polysilicon film is deposited. A film formation of the gate electrode material 10 is performed without doping dopant at a film formation temperature of 640° C. Doping of dopant into the gate electrode material 10 is performed in the subsequent ion implantation, where, for example, boron (B) is implanted into the gate electrode portion of the PMOS region Qp in an amount of, for example, $1 \times 10^{15}$ atoms/cm$^2$ and for example, phosphorus (P) is implanted into the NMOS region Qn in an amount of, for example, $6 \times 10^{15}$ atoms/cm$^2$, so that a p$^+$ type gate electrode portion and an n$^+$ type gate electrode portion are separately manufactured. The gate electrode portion serving as the select transistor in the memory region is implanted with, for example, boron so as to form a p$^+$ type gate electrode under the same conditions as those for the pMOS region Qp.

Figure 19:
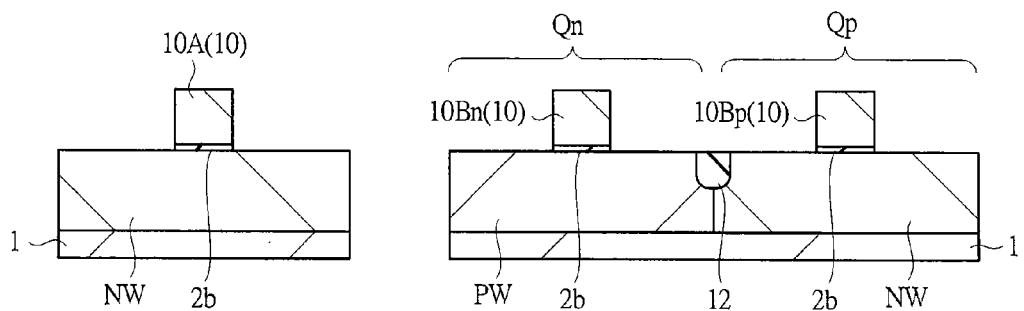
FIG. 19 is a sectional view of the main portion during a manufacturing step of the semiconductor device continued from FIG. 18.

Next, patterns for gate electrodes 10A, 10Bn, and 10Bp are formed by patterning the gate electrode material 10 using photolithography and dry etching, as shown in FIG. 19. Subsequently, after the semiconductor substrate 1 is subjected to sacrificial oxidation by, for example, 3 nm, for example, boron (BF$^{2+}$) is implanted into a surface layer of the semiconductor substrate 1 as counter ion implantation for threshold voltage adjustment of a memory transistor only in the memory region.

Figure 20:
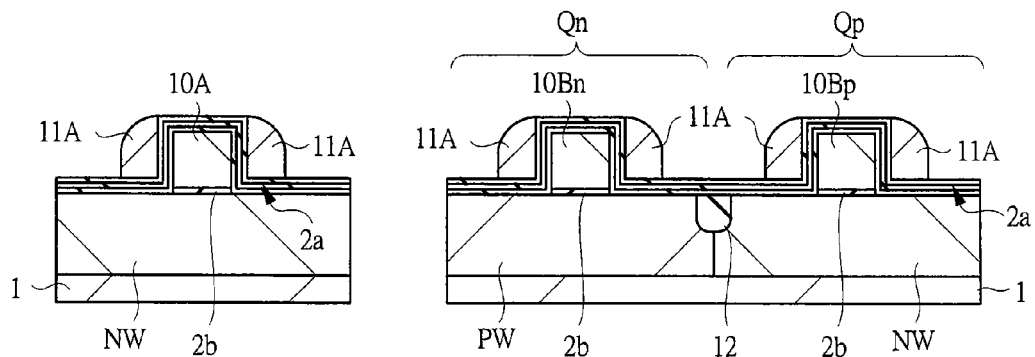
FIG. 20 is a sectional view of the main portion during a manufacturing step of the semiconductor device continued from FIG. 19.

Subsequently, as shown in FIG. 20, a gate dielectric 2a (ONO film, memory gate dielectric) comprising three layers of, for example, SiO$_2$ film/Si$_3$N$_4$ film/SiO$_2$-film (respective thicknesses thereof are, for example, 4 nm/8 nm/5 nm) is deposited as a charge trap film. The SiO$_2$ films in the gate dielectric 2a are formed on both the substrate side and the gate electrode side at a temperature of 900° C. with using, for example, ISSG oxidation method (InSitu Steam Generation). At this time, after formation of the SiO$_2$ film on the semiconductor substrate 1 side, interface strengthening is performed by, for example, a nitric oxide (NO) treatment. The Si$_3$N$_4$ film in the gate electrode film 2a is formed by a CVD (chemical vapor deposition) method.

Here, the dielectric film 2a2 in the gate dielectric 2a is a main charge trap film trapping most charges. A constituent material for the dielectric film 2a2 is here described as an Si$_3$N$_4$ film (silicon nitride), but since a stoichiometry of the Si$_3$N$_4$ film depends on film formation conditions, the expression thereof is not strict, and such an expression as an Si$_3$N$_4$ film may include material expressed as Si$_x$N$_y$. Incidentally, there is a possibility that various materials can be used as the charge trap film, but the Si$_3$N$_4$ film is normally used in view of affinity with the semiconductor process.

Subsequently, after an amorphous silicon film doped with dopant as second electrode material to be utilized as memory gate electrode material is deposited on the gate dielectric 2a, memory gate electrodes 11A are formed on both sides of each of the select gate electrode 10A and the gate electrodes 10Bn and 10Bp in a side wall shape by etching back the amorphous silicon film by anisotropic dry etching to leave the amorphous silicon film, as shown in FIG. 20. By doping, for example, phosphorus as dopant into the memory gate electrodes 11A in an amount of $4 \times 10^{20}$ atoms/cm$^3$ or more, n$^+$ type gate electrodes are formed.

Figure 21:
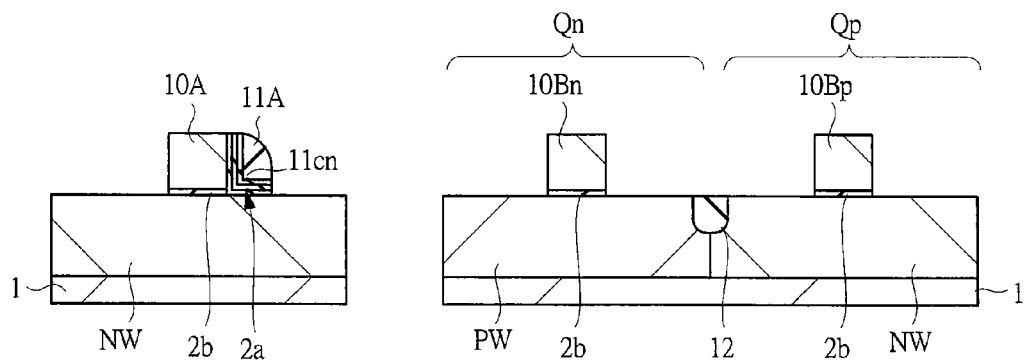
FIG. 21 is a sectional view of the main portion during a manufacturing step of the semiconductor device continued from FIG. 20.

Thereafter, unnecessary memory gate electrodes 11A on one side of the select gate electrode 10A in the memory region and on both sides of each of the gate electrodes 10Bn and 10Bp in the logic region are removed by photolithography and dry etching, as shown in FIG. 21. Further, exposed excessive gate dielectrics 2a (ONO film) are removed by dry etching and wet etching. In the memory gate electrode 11A, a corner portion 11cn is formed at the side adjacent to the select gate electrode 10A (at the side contacting the gate dielectric 2a).

Thereafter, in order to form extension regions, ion implantation of, for example, boron (BF$^{2+}$) is performed in the memory region at 7 keV in an amount of $6 \times 10^{13}$ atoms/cm$^2$, ion implantation of, for example, boron (BF$^{2+}$) is performed in the PMOS region Qp in the logic region at 5 keV in an amount of $1 \times 10^{14}$ atoms/cm$^2$, and ion implantation of, for example, arsenic (As) is performed in the NMOS region Qn in the logic region at 5 keV in an amount of $6 \times 10^{14}$ atoms/cm$^2$. The dose amount of dopant in the memory region is set to be less than the dose amount of dopant on the logic region in order to protect the memory gate electrode 11A and prevent dopant from penetrating near the side wall edge.

Figure 22:
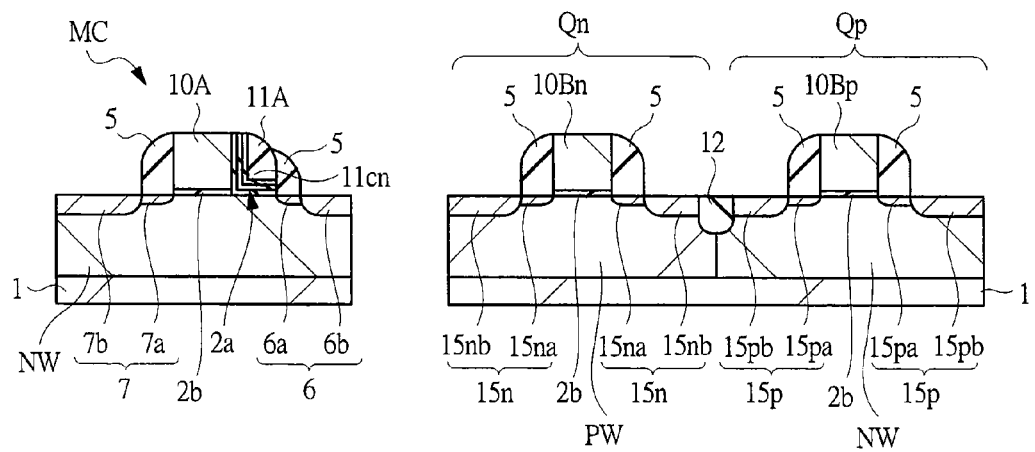
FIG. 22 is a sectional view of the main portion during a manufacturing step of the semiconductor device continued from FIG. 21.

By doing this, as shown in FIG. 22, lightly doped n type regions 6a and 7a for extension are formed in the memory region, lightly doped regions 15na and 15na for extension are formed in the NMOS region Qn in the logic region, and lightly doped regions 15pa and 15pa for extension are formed in the PMOS region Qp in the logic region.

Subsequently, after a dielectric film composed of SiO$_2$ is formed on the main surface of the semiconductor substrate 1, side walls 5 are formed on sides of the gate electrodes 10A and 11A in the memory region and side walls of the gate electrodes 10Bn and 10Bp in the logic region.

Thereafter, ion implantation of, for example, boron (B$^+$) is performed in both the memory region and the PMOS portion Qp in the logic region under the conditions at 15 keV in an amount of $1 \times 10^{13}$ atoms/cm$^2$ in order to form a highly doped region. Further, ion implantation of, for example, boron (BF$^{2+}$) is performed in the logic region under the conditions at 20 keV in an amount of $2 \times 10^{15}$ atoms/cm$^2$ and ion implantation of, for example, boron (BF$^{2+}$) is performed in the memory region under the conditions at 15 keV and in an amount of $1 \times 10^{15}$ atoms/cm$^2$. The implantation energy of dopant and the dose amount of dopant in the memory region are set to be less than the implantation energy of dopant and the dose amount of dopant on the logic region in order to protect the memory gate electrode 11A and prevent dopant from penetrating near the side wall edge. By doing this, doped regions 6 and 7 for a source and a drain are formed in the memory region by forming highly doped n type regions 6b and 7b. Also, doped regions 15p for a source and a drain are formed in the PMOS region Qp in the logic region by forming highly-doped regions 15pb and 15pb.

Further, for example, arsenic is implanted into the nMOS region Qn in the logic region under the conditions at 50 keV in an amount of $2 \times 10^{15}$ atoms/cm$^2$ and, for example, phosphorus is implanted into the NMOS region Qn in the logic region under the conditions at 40 keV in an amount of $1 \times 10^{13}$ atoms/cm$^2$. By doing this, doped regions 15n for a source and a drain are formed in the NMOS region Qn in the logic region by forming highly-doped regions 15nb and 15nb.

Incidentally, in formation of the extensions and the highly-doped regions, use of different ion implantation conditions for the memory region and the PMOS portion Qp in the logic region results in increase of the number of steps. However, it is required to pay attention that the ion implantation conditions of the implantation energy and the dose amount are weakened in consideration of that the polarity of the n$^+$ type gate electrode of the memory gate electrode 11A should not be inverted by the p type dopant ion-implanted into the extension and the highly doped region ion-implanted in a self align manner. A basic structure of the memory region is completed thorough the above-mentioned processes. Thereafter, as with the explanations with reference to the above-mentioned FIGS. 15 and 16, annealing and silicidation are performed, and then a standard process repeating metallization steps for 3 to 6 layers (dielectric film formation, contact portion formation, and metallization) are performed. A cleaning step or an inspecting step is interposed in the normal manner between the above-mentioned steps as needed.

Next, an operating method of the nonvolatile memory cell MC of the semiconductor device according to the present embodiment having the charge trap layer in the gate dielectric will be explained.

Figure 23:
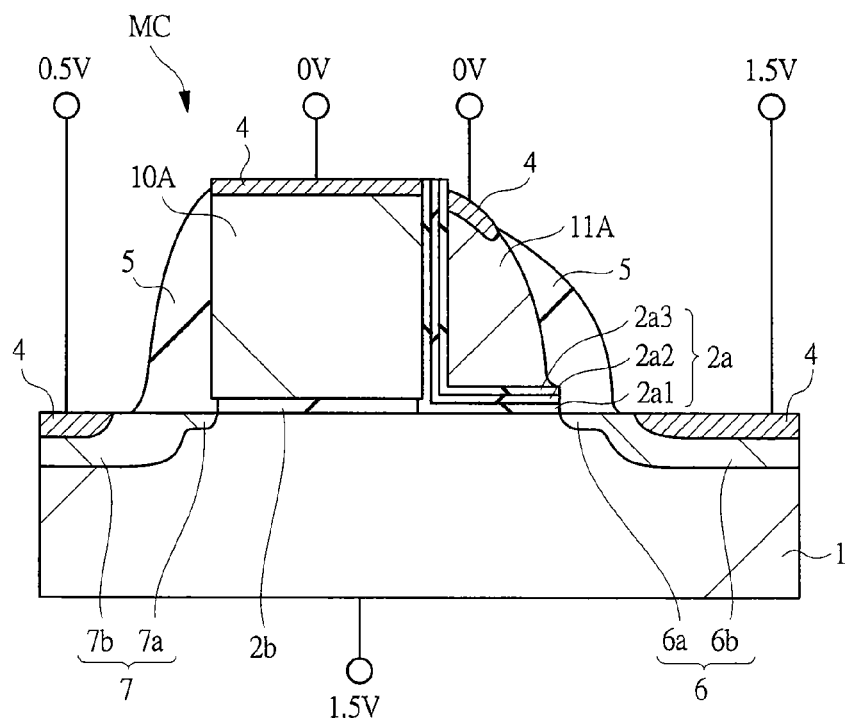
FIG. 23 is a sectional view of a main portion of a semiconductor substrate showing an operating state at the time of read in a semiconductor device according to an embodiment of the present invention.

The memory cell according to the embodiment uses PMOS against NMOS in conductive type of carrier as a MOS transistor. A read operation condition is shown in FIG. 23. Because the memory cell is PMOS type, when a negative voltage is applied to the gate electrode and the semiconductor substrate 1 and the source (doped region 6) are basically made to have the same potential, ON current flows. However, here, a different operation is adopted, in which when 1.5 V of the power source voltages are applied to the semiconductor substrate 1 and the source (doped region 6) so that the select gate electrode 10A and the memory gate electrode 11 have relatively negative potential of, for example, 0 V, the ON current flows. This is to operate without a negative voltage like the way in the logic region. When electrons or holes are injected into the dielectric film 2a2 (silicon nitride, main charge trap film) of the gate dielectric 2a (ONO film) in the memory cell MC, a threshold voltage of the memory transistor changes so that nonvolatile information storage is performed.

At a read operation, OFF state is determined when off-leak current in the memory cell MC is a certain value or less. For that purpose, holes are injected until the threshold voltage becomes a reference value or less. On the contrary, ON state is determined when ON current having a certain amount or more flows. For that purpose, a necessary amount of electrons is injected. An absolute amount of the ON current is determined according to a read operation frequency, where ordinary read operation of, for example, approximately 20 MHz requires a current value of only 5 µA/bit. When high-speed read is performed at a frequency of 50 to 80 MHz, for example, a current value of 10 to 30 µA/bit is required. This system in which the transistor in the memory cell MC is of the PMOS type is disadvantageous regarding the ON current in principle as compared with the system using the nMOS type which can obtain double read current when these types have the same dimension, but because the former has a memory gate length as extremely short as, for example, 50 nm and has the side wall gate with a low channel resistance; and electrons are injected more easily than holes, the threshold voltage can be raised largely (in a trend in which current of PMOS increases) and the like, so that a current value of, for example, approximately 20 µA/bit can be obtained. Therefore, this system can be adopted to almost all applications.

Figure 24:
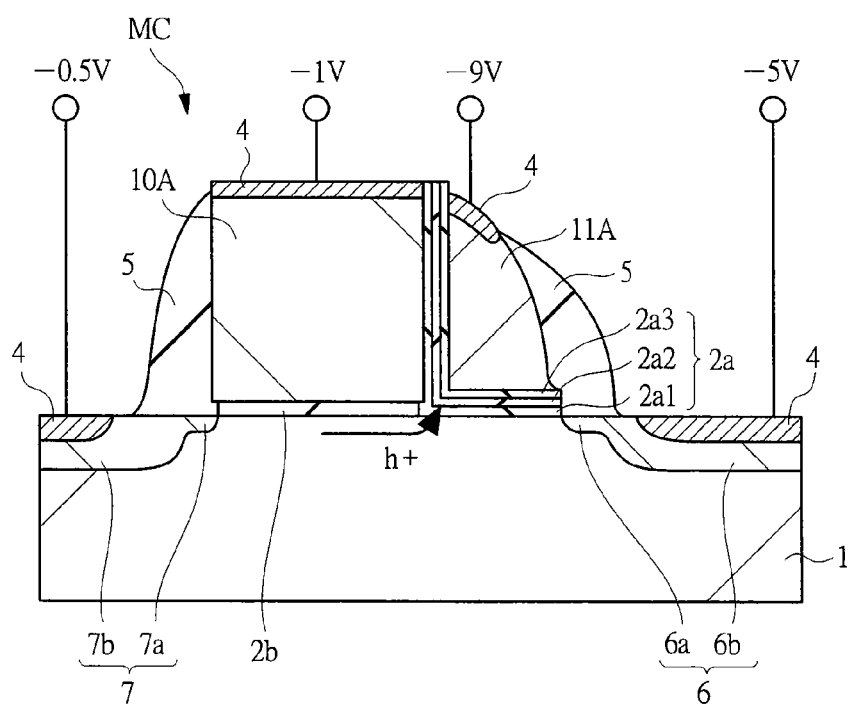
FIG. 24 is a sectional view of the main portion of the semiconductor substrate showing an operating state at the time of write in the semiconductor device according to the embodiment of the present invention.

A write operation condition is shown in FIG. 24. The source-side injection (SSI) is used for write operation like the above, but holes are injected into the gate dielectric 2a (mainly the dielectric film 2a2) instead of electrons. In a state that the memory gate electrode 11A has been applied with a voltage of, for example, −9 V and the source (doped region 6) has been applied with a voltage of, for example, −5 V, the select gate electrode 10A and the drain (doped region 7) are respectively applied with voltages of, for example, −1 V and −0.5 V to produce a weak inversion state under the select gate electrode 10A. Then, hot holes are generated due to a high electric field generated between the memory gate electrode 11A and the source voltage applied to the weak inversion state portion under the memory gate electrode 11A, so that holes can be efficiently injected into the gate dielectric 2a (mainly the dielectric layer 2a2 (silicon nitride as a main charge trap film) in the ONO film) by a large negative voltage at the memory gate electrode 11A. Since the SSI is higher in injection efficiency than the hole injection due to band to band tunneling used in the examined example, damage to the gate dielectric 2a (ONO film) can be reduced even if the amounts of hole injected by the SSI and by the band to band tunneling are the same. Here, the state that the absolute value of the threshold voltage has been lowered by the hole injection is defined as the write state in the memory cell MC. Whether or not write to each memory cell MC is performed can be determined by controlling the current flowing under the select gate electrode 10A according to magnitude of a drain voltage connected to a bit line.

Figure 25:
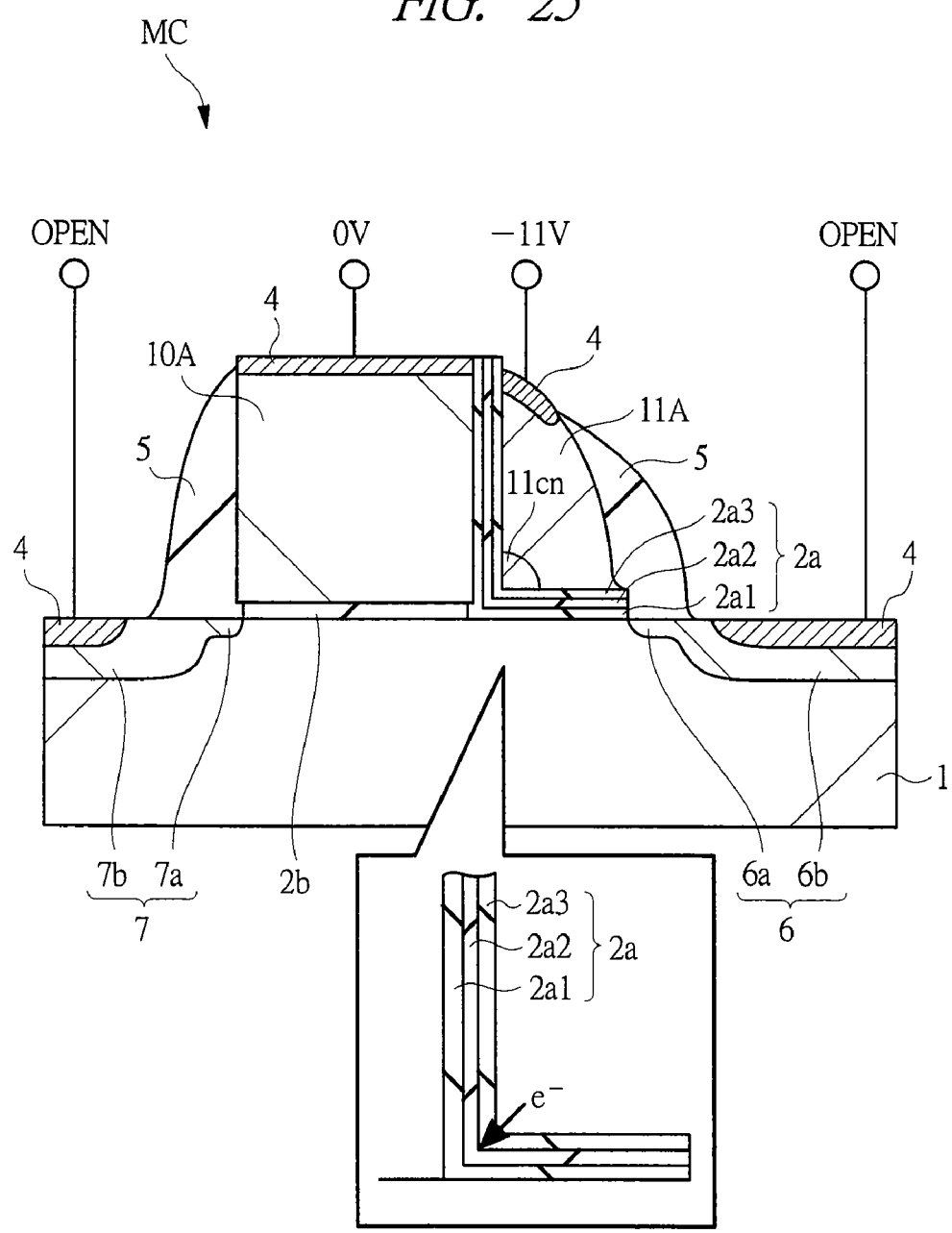
FIG. 25 is a sectional view of the main portion of the semiconductor substrate showing an operating state at the time of erase in the semiconductor device according to the embodiment of the present invention.

An operating state at the time of erase is shown in FIG. 25. In the operation at the erase time, only the memory gate electrode 11A is applied with a negative voltage of, for example, −11 V and the remaining terminals are applied with a voltage of, for example, 0 V, or they are opened. Here, in view of the circuit convenience, the source (doped region 6) and the drain (doped region 7) are, for example, opened and the select gate electrode 10A and the semiconductor substrate 1 are applied with a voltage of, for example, 0 V or they are grounded. An electric field "averagely" applied to the gate dielectric 2a (ONO film) due to a potential difference between the memory gate electrode 11A and the semiconductor substrate 1 is, for example, 8 MV/cm. The value is never small but it is insufficient for injecting charges by the Fowler-Nordheim tunneling operation within an erase time. However, in the memory gate electrode 11A, since an equipotential plane changes rapidly at the corner portion 11cn formed at a portion where a side surface contacting with the gate dielectric 2a positioned at a side surface of the select gate electrode 10A and a side surface contacting with the gate dielectric 2a on the main surface of the semiconductor substrate 1 intersect, an electric field concentrates locally at the portion, so that an electric field with, for example, 10 MV/cm or higher required for high-speed Fowler-Nordheim tunneling operation can be obtained. Accordingly, electrons are injected from the corner portion 11cn of the memory gate electrode 11A to the dielectric film 2a2 (main charge trap film) in the gate dielectric 2a (ONO film) so that an erase operation is performed by rising of the absolute value of the threshold voltage.

Figure 26:
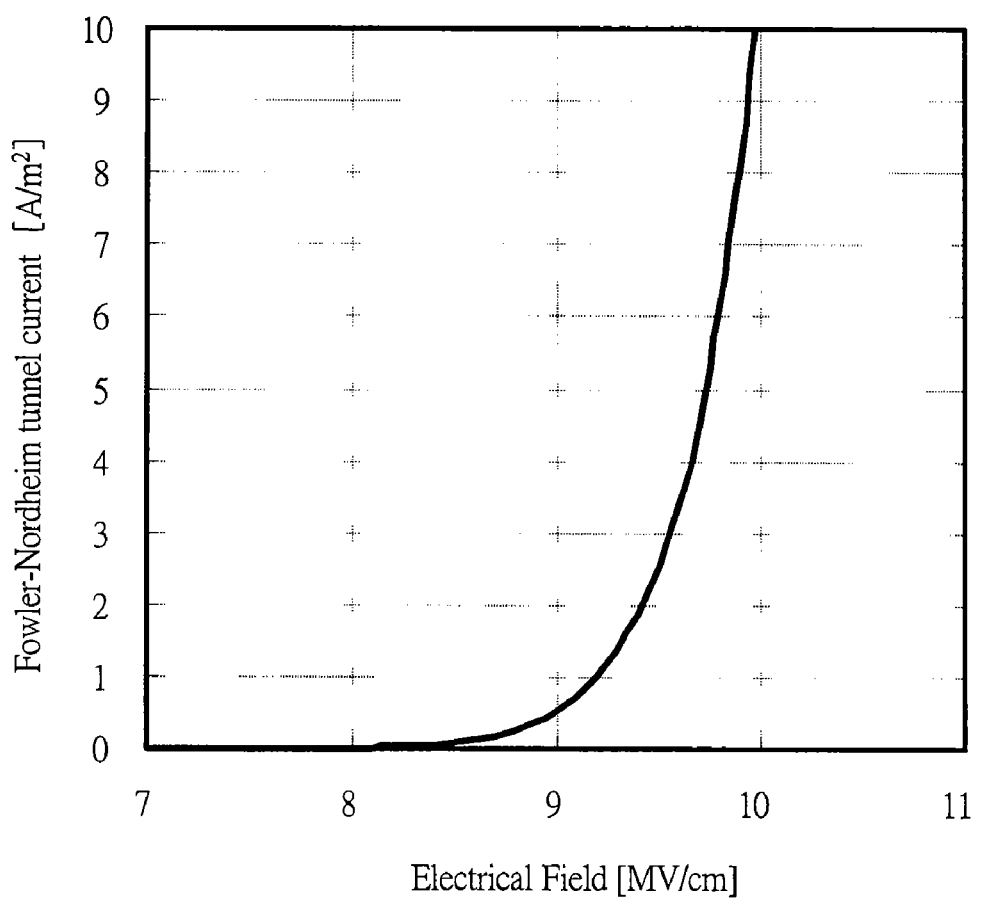
FIG. 26 is a graph chart showing a relationship between electric field and Fowler-Nordheim tunneling current.

Here, a relationship between the electric field and the Fowler-Nordheim tunnel current is shown in FIG. 26. The Fowler-Nordheim tunnel current is expressed by $J=AE^2\exp(-B/E)$ (E: electric field; A and B: constant), and the tunnel current rises up sharply because it is changed with respect to an electric field in an exponential manner. Accordingly, as described above, electron injection is insufficient in an electric field of 8 MV/cm and substantial injection takes place in an electric field of 10 MV/cm or more. Here, when an electric field of 11 MV/cm or more is averagely acts on a flat portion of the gate dielectric 2a (ONO film), excessive electron injection occurs on the whole area of the flat portion, which is not desirable. In order to obtain an effect of charge injection due to local electric field concentration according to the embodiment, it is desirable to make such design that a value of an electric field acting on the flat portion of the gate dielectric 2a (ONO film) due to a potential difference between the memory gate electrode 11A and the semiconductor substrate 1 is averagely in a range of 7 MV/cm to 11 MV/cm. At this time, charge injection due to local electric field concentration takes place while a whole face injection is suppressed.

Figure 27:
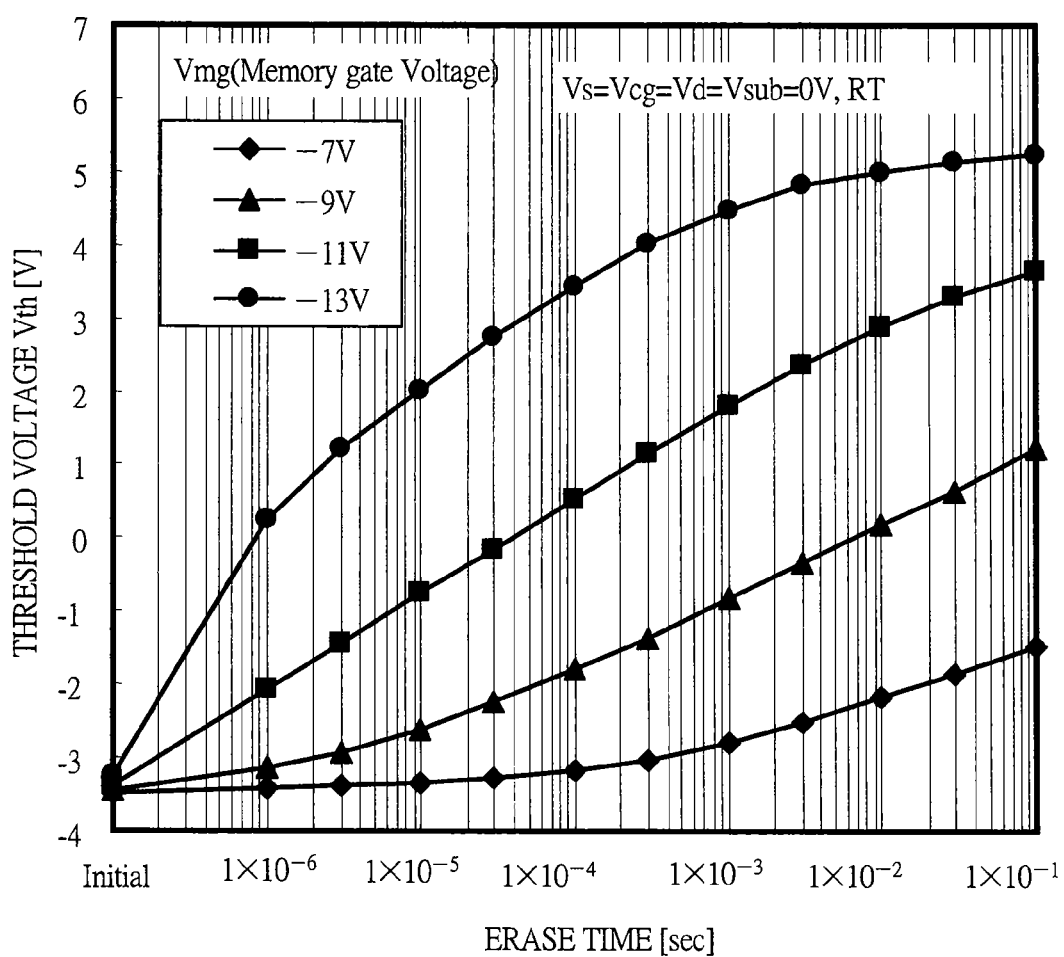
FIG. 27 is a graph chart showing the result obtained by measuring erase characteristic (threshold voltage-erase time) of a semiconductor device utilizing a memory gate voltage as a parameter.

The result obtained by measuring erase characteristic (threshold voltage-erase time) of the device using the memory gate voltage as a parameter is shown in FIG. 27. Here, source voltage Vs=select gate voltage Vcg=drain voltage Vd=substrate voltage Vsub=0 V.

According to the structure, all memory cells MC on the same word line sharing the memory gate electrode 11A applied with a negative voltage are simultaneously erased, but since erase of a flash memory is collectively erased, there is no inconvenience. Further, since erase current of Fowler-Nordheim tunnel is almost zero, all the memory gate electrodes 11A on the erase block can be erased simultaneously.

Voltages of the read state, the write state, and the erase state described above are collectively shown in FIG. 28. Incidentally, FIG. 28 shows the case that a potential of the semiconductor substrate 1 is set to the power source voltage Vcc to read without using any negative voltages and the case that the memory gate electrode 11A is made to be in a bias retention state.

Second Embodiment

Figure 29:
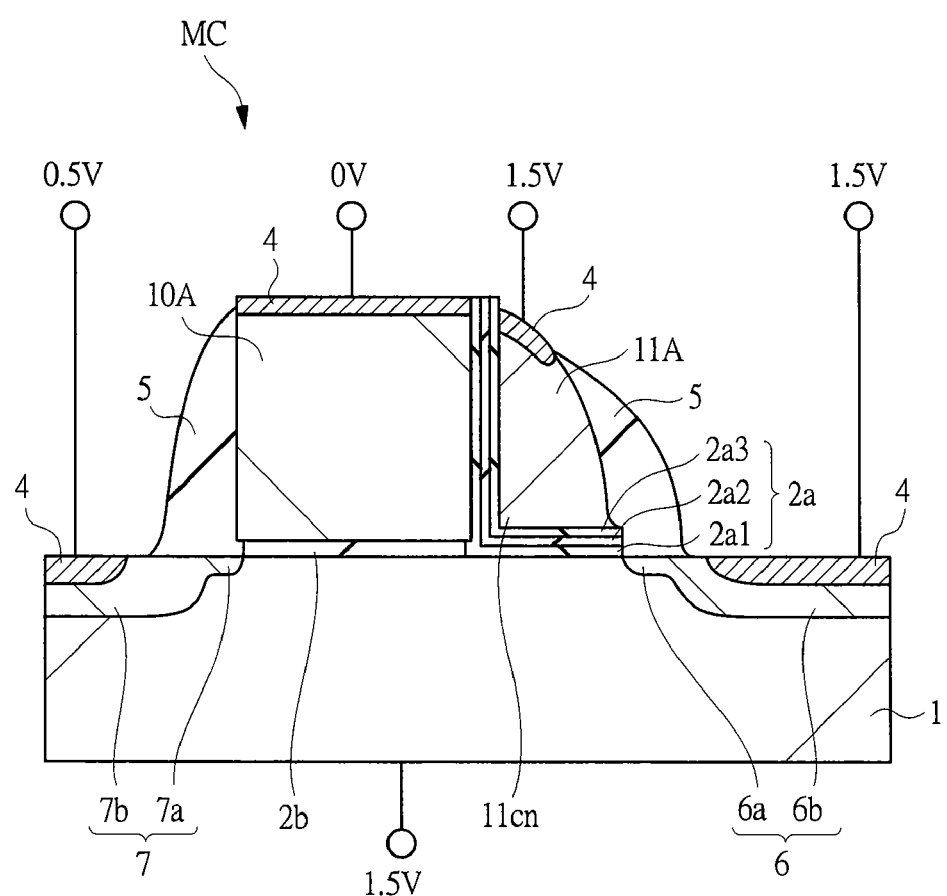
FIG. 29 is a sectional view of a memory cell in a semiconductor device according to another embodiment (second embodiment) of the present invention.

As a modification of the first embodiment, a semiconductor device according to a second embodiment will be explained with reference to FIG. 29. FIG. 29 is a sectional view of a memory cell MC of the semiconductor device according to the second embodiment. In order to clarify a difference between the first embodiment and the second embodiment, an operation voltage is shown in FIG. 30. Incidentally, FIG. 30 shows a case that a potential of the semiconductor substrate 1 is set to the power source voltage Vcc to read without using any negative voltages and a case that the memory gate electrode 11A is made to be in a non-biased (Vmg=Vsub) retention state.

A voltage applied to the memory gate electrode 11A at the time of read is set to a voltage of, for example, 1.5 V which is the same power source voltage as the semiconductor substrate 1. A difference from the first embodiment is a memory gate voltage Vmg at the time of read, and by setting this voltage to be equal to that of the substrate side, an electric field (electrode potential–substrate potential) acting on the gate dielectric 2a (ONO film) at the time of read can be balanced to zero. As a result, diffusion of charges due to the electric field is suppressed, so that the retention characteristic is improved. As a demerit thereof, the threshold voltage of the memory cell MC is required to be raised. Therefore, an amount of a counter channel ion implantation is required to be increased while a sub-threshold characteristic is allowed to be degraded, or an injection electron amount at the time of erase is required to be increased while load to (program and erase) endurance is allowed to be increased. It is possible to make proper design according to targeted specification in each case.

Third Embodiment

A third embodiment is a modification example of the structure of the semiconductor device according to the first embodiment. Part of a manufacturing flow of the semiconductor device according to the third embodiment, which is different from the manufacturing flow of the first embodiment, will be explained with reference to FIGS. 31 and 32.

First, the same manufacturing process as that of the steps of the first embodiment explained with reference to FIGS. 17 to 19 is performed in this embodiment. At this stage, a select gate electrode 10A is formed on a main face of a semiconductor substrate 1 via a gate dielectric 2b.

Figure 31:
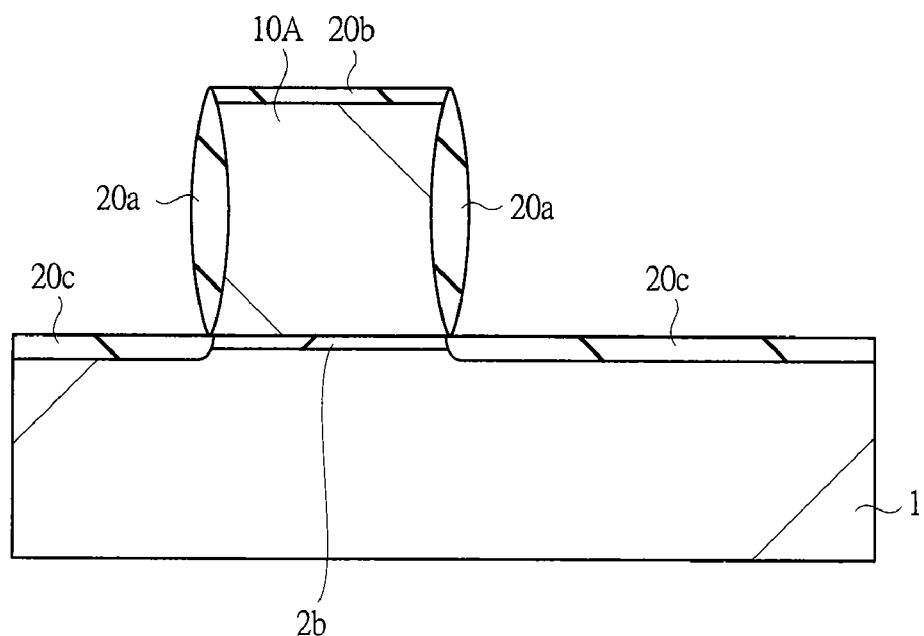
FIG. 31 is a sectional view of a memory cell during manufacturing step of a semiconductor device according to another embodiment (third embodiment) of the present invention.

Subsequently, in the third embodiment, dielectric films 20a, 20b, and 20c composed of silicon oxide are formed on a side surface, an upper surface of the select gate electrode 10A, and the main surface of the semiconductor substrate 1 by performing wet oxidization of 6 nm at a temperature of, for example, 800° C., as shown in FIG. 31. In this case, in the select gate electrode 10A with a high dopant concentration, particularly, a side wall central portion is oxidized in a further much amount in the select gate electrode 10A with a high dopant concentration, meanwhile an oxidation rate at an end portion (especially, a lower end portion) of the select gate electrode 10A is suppressed due to influence of stress. Since a difference in the oxidation rate due to the dopant concentration and the stress occurs as described above, the dielectric film 20a of the select gate electrode 10A becomes a spindle shape.

Figure 32:
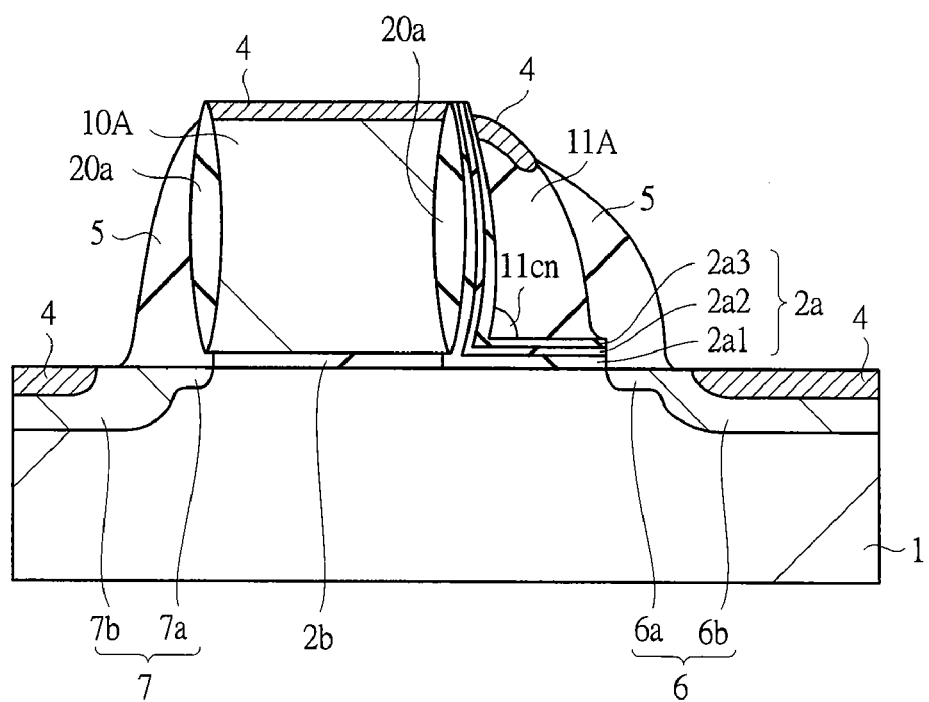
FIG. 32 is a sectional view of the memory cell during manufacturing step of the semiconductor device continued from FIG. 31.

Thereafter, after the dielectric film 20c on the main surface of the semiconductor substrate 1 is removed, as with the first embodiment, a memory cell MC shown in FIG. 32 is formed through the steps of counter ion implantation for threshold voltage adjustment of the memory region; film formation of the gate dielectric 2a (ONO film); deposition and etching-back of an amorphous silicon film doped with dopant; removal of excessive gate dielectric 2a (ONO film); extension formation; formation of side wall of oxide film; highly doped region formation; silicidation; and the like.

In the third embodiment, the corner portion 11cn (in the memory gate electrode 11A, a corner portion formed at a portion where a side surface contacting with the gate dielectric 2a positioned on the side surface of the select gate electrode 10A and a surface contacting with the gate dielectric 2a on the main surface of the semiconductor substrate 1 intersect) is formed to have a further acute angle (an angle smaller than 90°) with the dielectric film 20a formed in a spindle shape on a side surface of the select gate electrode 10A. As a result, since an electric field further concentrates at the corner portion 11cn of the memory gate electrode 11A in an erase operation as compared with the case of the first embodiment, an effective erase operation can be realized. In an actual product, this performance improvement is used for reduction of application voltage at the time of erase rather than for speed-up of erase, whereby reduction of a circuit area or improvement of reliability can be achieved.

Fourth Embodiment

A fourth embodiment is a modification example of the structure of the semiconductor device according to the first embodiment. Part of a manufacturing flow of the semiconductor device according to the fourth embodiment, which is different from the manufacturing flow of the first embodiment, will be explained with reference to FIG. 33

After the same manufacturing process as that at the steps of the first embodiment explained with FIGS. 17 to 18 is performed, photolithography for patterning a select gate electrode in a memory region is performed, and then the select gate electrode 10A is processed by dry etching. At this time, the dry etching conditions are changed from those of the first embodiment, so that a lower end portion (on the side of the semiconductor substrate 1) of the select gate electrode 10A is processed in a revere taper shape in a final stage of the gate etching step. A method for conducting such a process is known by those skilled in the art. Specifically, kind of gases, a temperature, and a plasma condition are changed in the final stage of the process so that a condition for reducing anisotropy such as reduction of side wall deposition is obtained.

Figure 33:
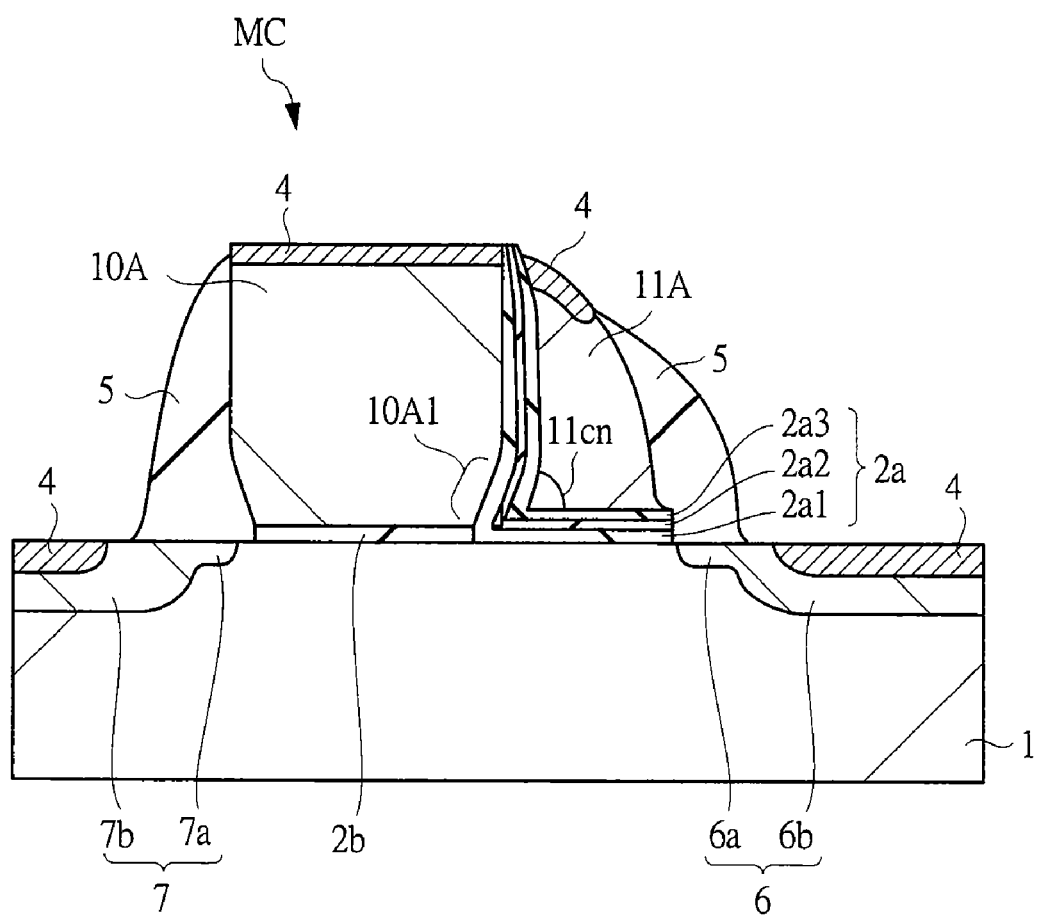
FIG. 33 is a sectional view of a memory cell during manufacturing step of a semiconductor device according to another embodiment (forth embodiment) of the present invention.

As a result, as a finished shape is shown in FIG. 33, a reverse taper-shaped portion 10A1 is formed on a side wall of the select gate electrode 10A. That is, a lower end portion of the select gate electrode 10A is formed so that a width (a size in a short side direction) of the select gate electrode 10A gradually increases with a distance from the main surface of the semiconductor substrate 1 increasing. As a result, the corner portion 11cn of the memory gate electrode 11A adjacent to the side wall of the select gate electrode 10A via the gate dielectric 2a is formed so as to have a further acute angle (an acute angle smaller than 90°).

The whole logic region is covered with photoresist in order to avoid unintended change of the characteristic due to simultaneous formation of a reverse taper shape on a side wall of the gate electrode of the MOS transistor in the logic region at the time of formation of the select gate electrode 10A. Thereafter, the gate process to the logic region is performed by the reverse method in a state that the memory region is covered with resist. As a result, an effect similar to the third embodiment can be obtained.

Incidentally, it is not always necessary to form the taper of the side wall of the select gate electrode 10A only on the lower end portion of the select gate electrode 10A, but the whole side wall of the select gate electrode 10A may be formed in a reverse taper shape.

Fifth Embodiment

A fifth embodiment includes a nonvolatile memory cell MC having the same split-gate structure as that of the semiconductor device according to the first embodiment, but the memory gate electrode is formed without the self align process, which is different from the first embodiment.

Figure 34:
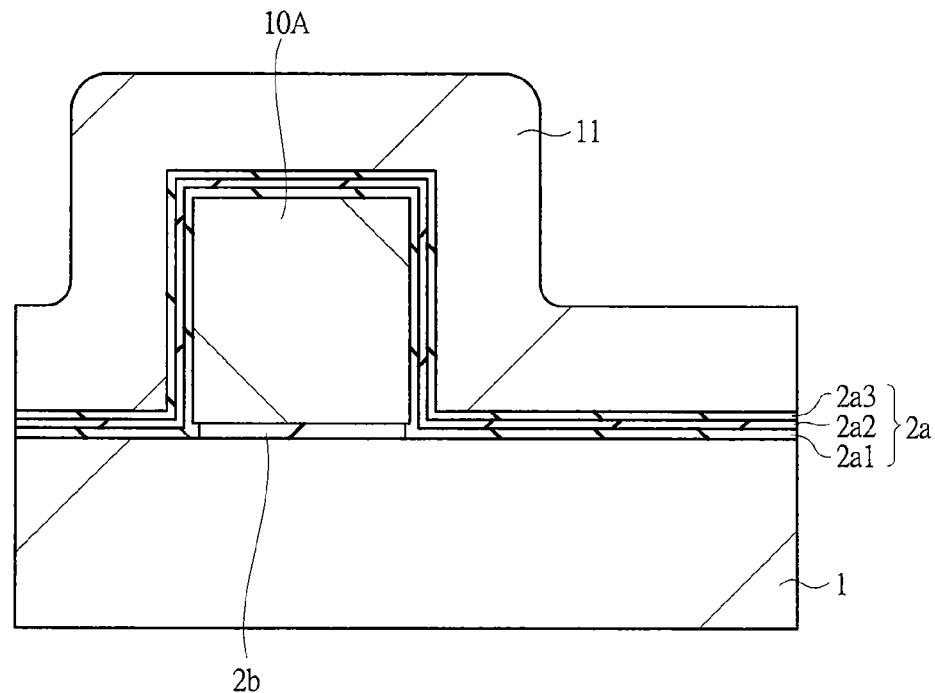
FIG. 34 is a sectional view of a memory cell during manufacturing step of a semiconductor device according to another embodiment (fifth embodiment) of the present invention.

After the same manufacturing process as that of the steps of the first embodiment explained with FIGS. 17 to 19 is performed, as with explanation of the first embodiment, sacrificial oxidation, counter ion implantation for threshold voltage adjustment of a memory region, and film formation of a gate dielectric 2a (ONO film) are performed. Thereafter, as shown in FIG. 34, gate electrode material 11 composed of, for example, amorphous silicon doped with dopant is deposited.

Figure 35:
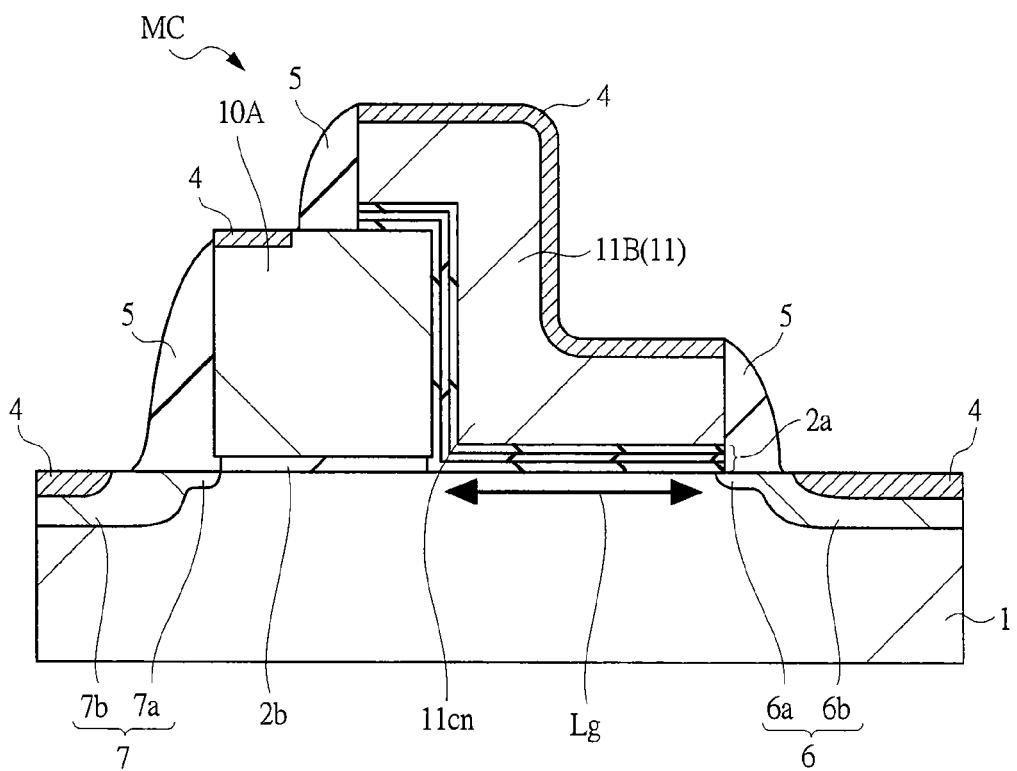
FIG. 35 is a sectional view of the memory cell during manufacturing step of the semiconductor device continued from FIG. 34.

Subsequently, in the fifth embodiment, a mask is formed using resist by photolithography without conducting etching-back directly to the gate electrode material 11, which is different from the first embodiment. Then by using the mask as an etching mask, a memory gate electrode 11B is patterned by conducting dry etching to the gate electrode material 11 as shown in FIG. 35. Here, an alignment-error width of the mask is designed to fall within a width (a size in a short side direction) of the select gate electrode 10A, and the memory gate electrode 11B is formed such that a portion thereof partially rides on the select gate electrode 10A. Thereafter, a memory cell MC is formed through steps similar to those of the first embodiment.

An operating system of the memory cell MC is similar to those of the first and second embodiments. In this structure, however, since a gate length Lg of the memory gate electrode 11B can be designed to be sufficiently long, ON current lowers but a short channel characteristic is improved. As a result, since OFF leak current or variation of characteristics can be suppressed, this embodiment is suitable for a device for low power consumption.

Sixth Embodiment

A semiconductor device according to a sixth embodiment also includes a nonvolatile memory cell MC with a split-gate structure. In the sixth embodiment, however, a memory gate electrode is formed prior to formation of a select gate electrode by using a process instead of a self align process, as well as the fifth embodiment.

Figure 36:
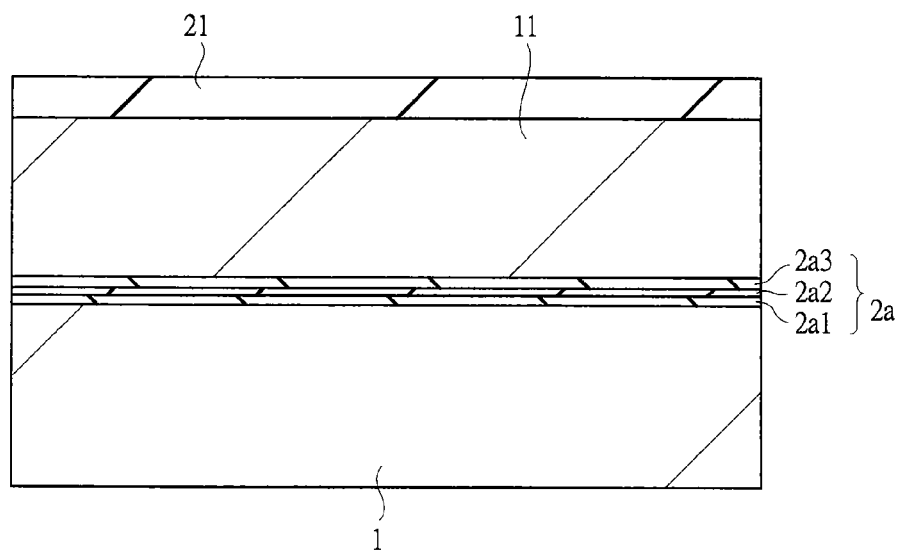
FIG. 36 is a sectional view of a memory cell during manufacturing step of a semiconductor device according to another embodiment (sixth embodiment) of the present invention.

First, sacrificial oxidation of 3 nm is performed to a semiconductor substrate 1 at a temperature of, for example, 800° C., and ion implantation into a channel is performed. Thereafter, a gate dielectric 2a is formed on a main surface of the semiconductor substrate 1 as shown in FIG. 36. The gate dielectric 2a has a structure of dielectric films 2a1, 2a2, and 2a3 stacked in order from a bottom layer. The dielectric film 2a1 is composed of, for example, a silicon oxide ($SiO_2$ film) and a thickness thereof is approximately 4 nm. The dielectric film 2a2 is composed of, for example, silicon nitride ($Si_3N_4$ film) and a thickness thereof is, for example, approximately 8 nm. The dielectric film 2a3 is composed of, for example, silicon oxide ($SiO_2$ film) and a thickness thereof is approximately 5 nm.

Subsequently, gate electrode material 11 for memory gate electrode formation is deposited on the gate dielectric 2a. The gate electrode material 11 is composed of, for example, polysilicon, and a thickness thereof is, for example, approximately 200 nm. In formation of the gate electrode material 11, for example as dopant, phosphorus in an amount of $4 \times 10^{20}$ atoms/$cm^3$ is doped into the gate electrode material 11, and a film formation temperature is, for example, 610° C.

Thereafter, a cap film 21 is formed on an upper face of the gate electrode material 11. The cap film 21 is composed of, for example, silicon oxide and a thickness thereof is, for example, 50 nm.

Figure 37:
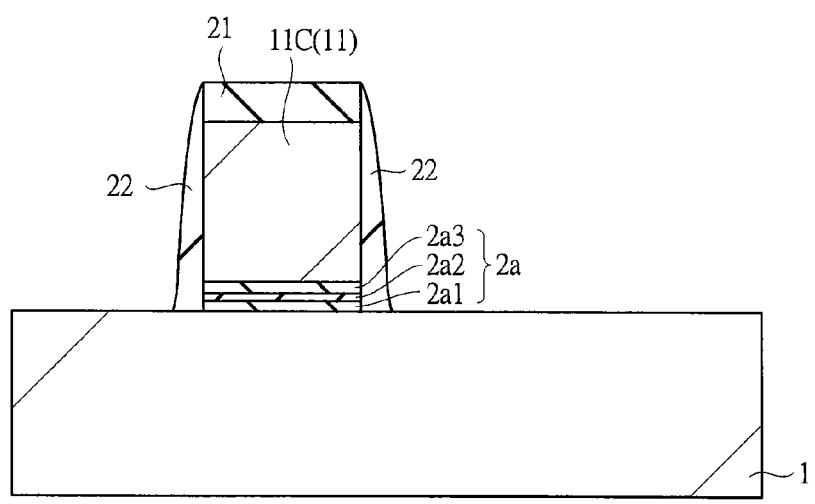
FIG. 37 is a sectional view of the memory cell during manufacturing step of the semiconductor device continued from FIG. 36.

Next, a memory gate electrode 11C is formed by photolithography and dry etching for formation of the memory gate electrode to the gate electrode material 11, as shown in FIG. 37. Subsequently, after a dielectric film composed of, for example, silicon oxide is deposited on the main surface of the semiconductor substrate 1 so as to cover the memory gate electrode 11C, a small side wall spacer 22 composed of the above-mentioned dielectric film is formed on a side face of the memory gate electrode 11C by conducting etching-back to the dielectric film.

Figure 38:
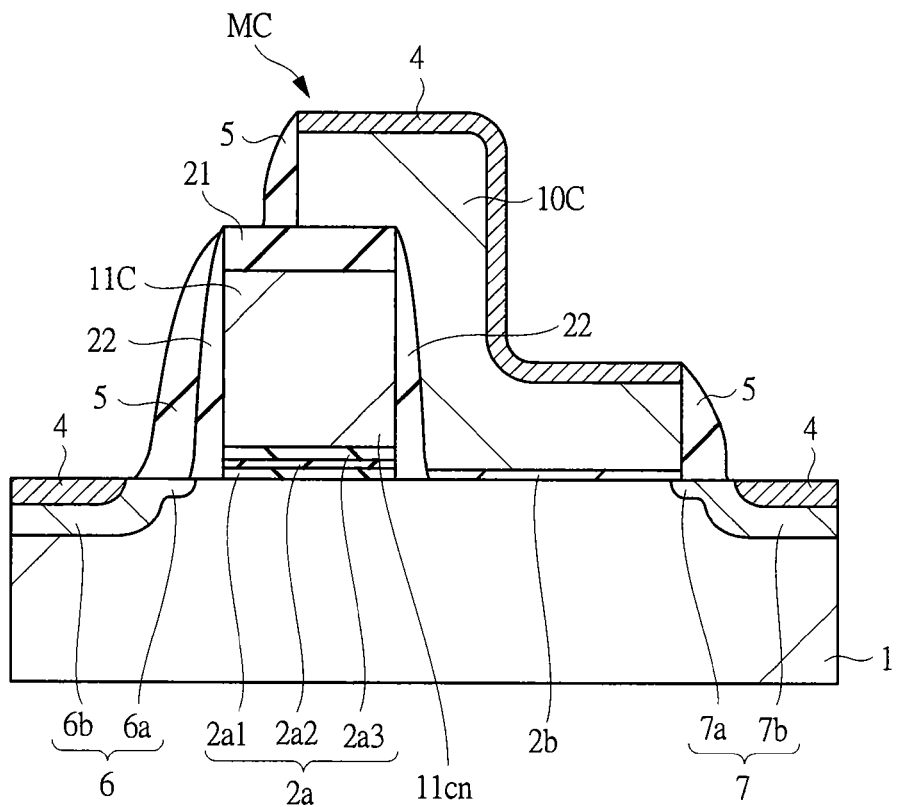
FIG. 38 is a sectional view of the memory cell during manufacturing step of the semiconductor device continued from FIG. 37.

Next, after the semiconductor substrate 1 is subjected to sacrificial oxidation processing, a gate dielectric 2b composed of, for example, silicon oxide with a thickness of approximately 2 nm is formed by conducting thermal oxidation processing to the semiconductor substrate 1, for example, at a temperature of, approximately 800° C., as shown in FIG. 38. The gate dielectric 2b serves as a gate dielectric common to a select gate transistor in a memory region and a transistor in a logic region. Subsequently, after a polysilicon film with a thickness of, for example, 220 nm is deposited over the main surface of the semiconductor substrate 1, for example, boron is ion-implanted into a gate electrode formation region in the memory region and a pMOS portion Qp of the logic region in the polysilicon film. For example, phosphorus is ion-implanted into the NMOS portion Qn of the logic region.

Next, a select gate electrode 10C is formed in the memory region and gate electrodes 10Bn and 10Bp (see FIG. 22) are formed in the logic region by patterning the polysilicon film by photolithography and dry etching. Subsequently, as with the above mentioned steps, extension formation; oxide film side wall formation; highly doped region formation; and silicidation are performed, whereby a memory cell MC is completed.

In the sixth embodiment, the memory transistor is formed in first, so that oxide film quality of the gate dielectric 2a (ONO film) in the memory region can be improved. Therefore, there are advantages in which retention characteristic can be improved and since counter ion implantation to the channel of the memory transistor is not required, short channel characteristic can be improved. Since improvement of the short channel characteristic can reduce OFF leak to obtain characteristic suitable for a device for low power consumption, and can improve disturb characteristic, design of a memory array with a small circuit area can be realized.

Seventh Embodiment

A semiconductor device according to a seventh embodiment is a MONOS memory with a NROM structure.

First, as well as the sixth embodiment, a semiconductor substrate 1 is subjected to sacrificial oxidation of 3 nm at a temperature of, for example, 800° C. and ion-implantation to a channel is performed, and then a gate dielectric 2a is formed on a main surface of the semiconductor substrate 1, as shown in the above-mentioned FIG. 36. The gate dielectric 2a has a structure of dielectric films 2a1, 2a2, and 2a3 stacked in order from a bottom layer. Materials and thicknesses of the dielectric films 2a1, 2a2, and 2a3 are the same as those of the sixth embodiment.

Figure 39:
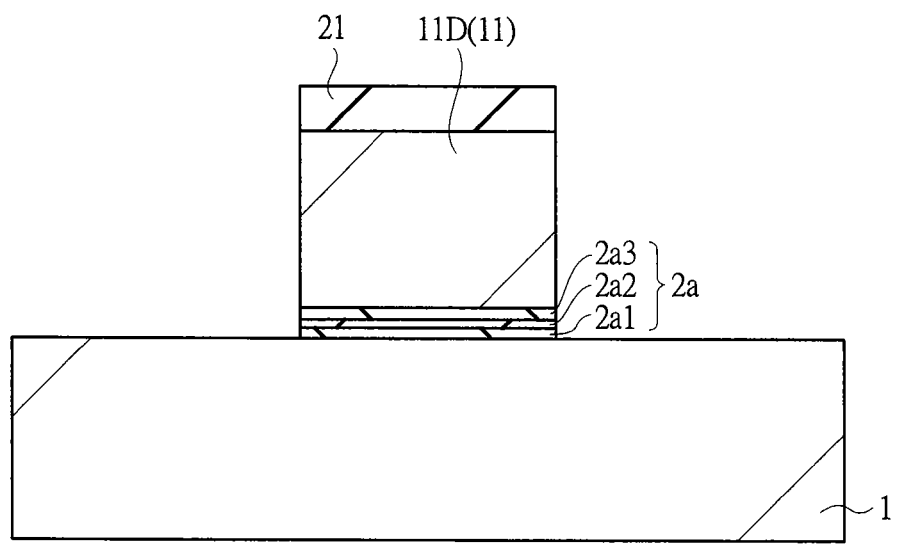
FIG. 39 is a sectional view of a memory cell during manufacturing step of a semiconductor device according to another embodiment (seventh embodiment) of the present invention.

Subsequently, after gate electrode material 11 for memory gate electrode formation is deposited on the gate dielectric 2a as well as the sixth embodiment, a cap film 21 is formed on an upper surface of the gate electrode material 11. As described above, the gate electrode material 11 is doped with, for example, phosphorus in an amount of $4 \times 10^{20}$ atoms/cm$^3$ as dopant. Thereafter, a memory gate electrode 11D is formed by conducting photolithography and dry etching for gate electrode formation to the gate electrode material 11 as well as the sixth embodiment, as shown in FIG. 39.

Figure 40:
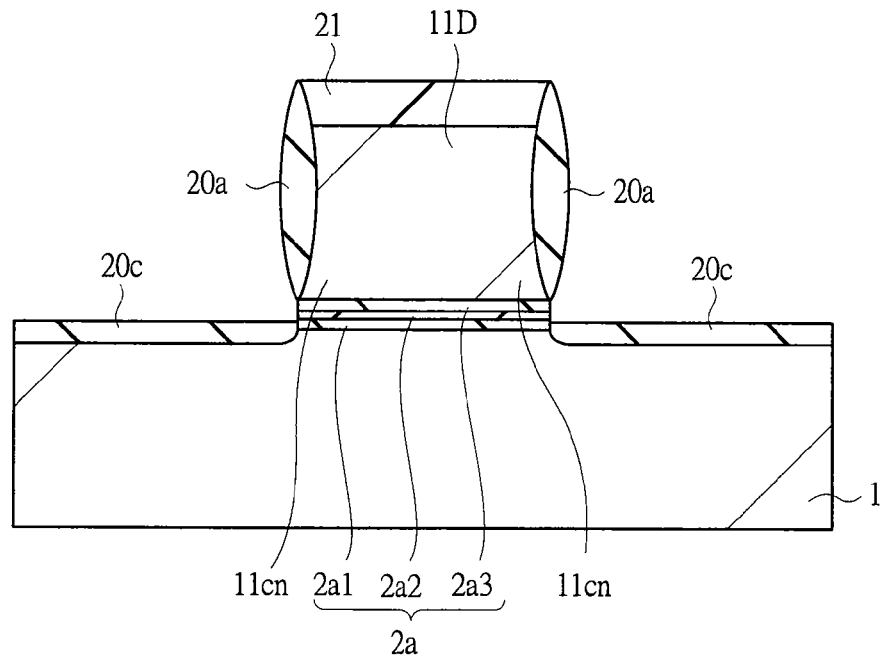
FIG. 40 is a sectional view of the memory cell during manufacturing step of the semiconductor device continued from FIG. 39.

Thereafter, dielectric films 20a and 20c are formed on a side surface of the memory gate electrode 11D and the main surface of the semiconductor substrate 1 by conducting wet oxidation processing of 6 nm at a temperature of, for example, 800° C., as shown in FIG. 40. In this case, a highly doped side wall central portion is oxidized especially more in the memory gate electrode 11D, but an oxidation rate at an end portion (especially, a lower end portion) of the memory gate electrode 11D is suppressed due to influence of stress. Since a difference in oxidation rate occurs due to the dopant concentration and the stress in this manner, the dielectric film 20a on the side surface of the memory gate electrode 11D becomes spindle-shape. As a result, corner portions 11cn at both lower ends of the memory gate electrode 11D in a widthwise direction (short side direction) thereof are formed to have a more acute angle (a portion with an acute angle smaller than 90°).

Figure 41:
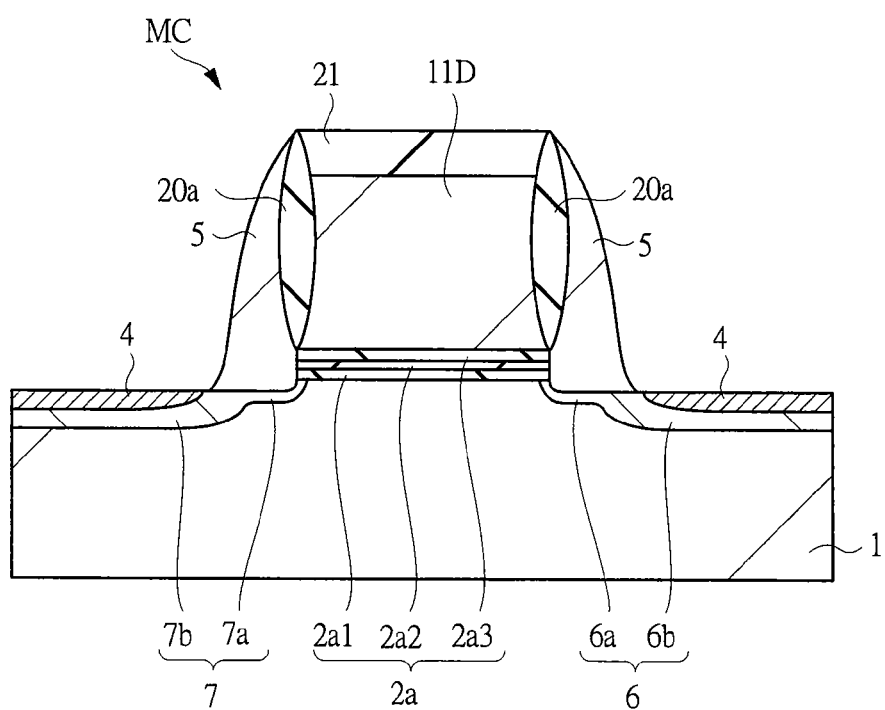
FIG. 41 is a sectional view of the memory cell during manufacturing step of the semiconductor device continued from FIG. 40.

Next, after the dielectric film 20c on the main surface of the semiconductor substrate 1 is removed, as shown in FIG. 41, boron for extension formation or the like is ion-implanted to form lightly doped regions 6a and 7a on the main surface of the semiconductor substrate 1.

Subsequently, after, for example, silicon oxide (SiO$_2$ film) 80 nm is deposited over the main surface of the semiconductor substrate 1 so as to cover the memory gate electrode 11D, the silicon oxide is etched back to form a side wall spacer 5 on a side wall of the memory gate electrode 11D via the dielectric film 20a.

Thereafter, highly doped regions 6b and 7b are formed on the main surface of the semiconductor substrate 1 by ion-implantation of, for example, boron, so that a memory cell MC is completed. The memory cell MC of the seventh embodiment operates as PMOS like the memory cell MC of the first embodiment, but the memory gate electrode 11D is of n$^+$ type. Thereafter, ordinary transistor formation steps are performed for a logic region.

Next, an operating method of the memory cell MC of the semiconductor device according to the seventh embodiment will be explained.

Figure 42:
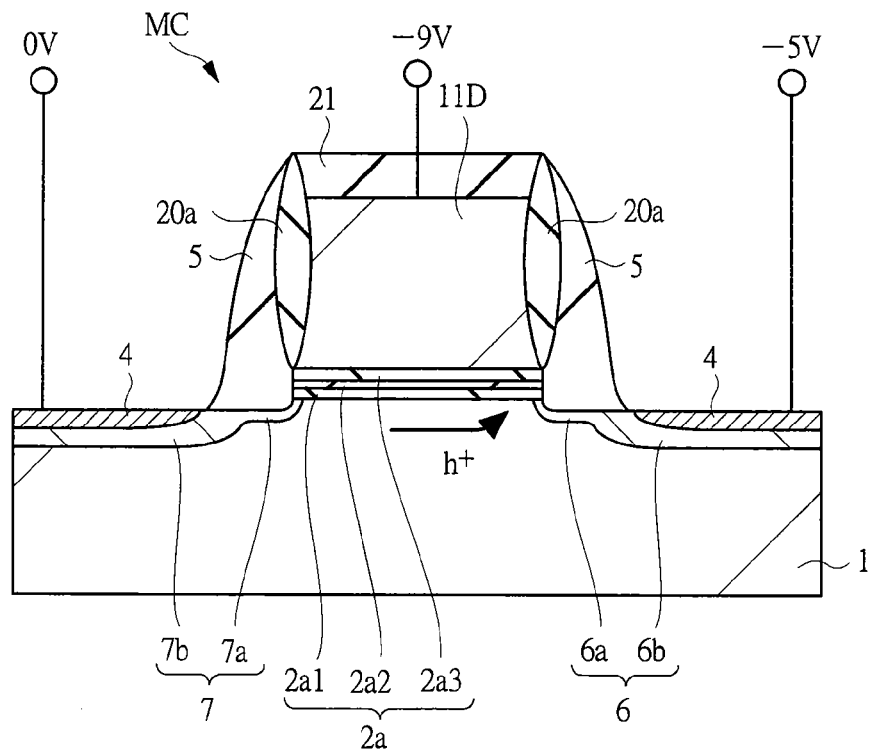
FIG. 42 is a sectional view of a main portion of a semiconductor substrate showing an operating state at the time of write in the semiconductor device according to the seventh embodiment.

Write is performed by channel hot hole injection. That is, as shown in FIG. 42, the memory gate electrode 11D is applied with a voltage of, for example, −9 V and the doped region 6 (here, a side to be injected with charges, called "source") is applied with a voltage of, for example, −5 V. From this state, current of, for example, approximately 50 μA/bit is carried into a channel so that holes at an end of the drain (doped region 7) of the channel are injected into the memory gate to lower a threshold voltage, whereby the write is conducted.

Figure 43:
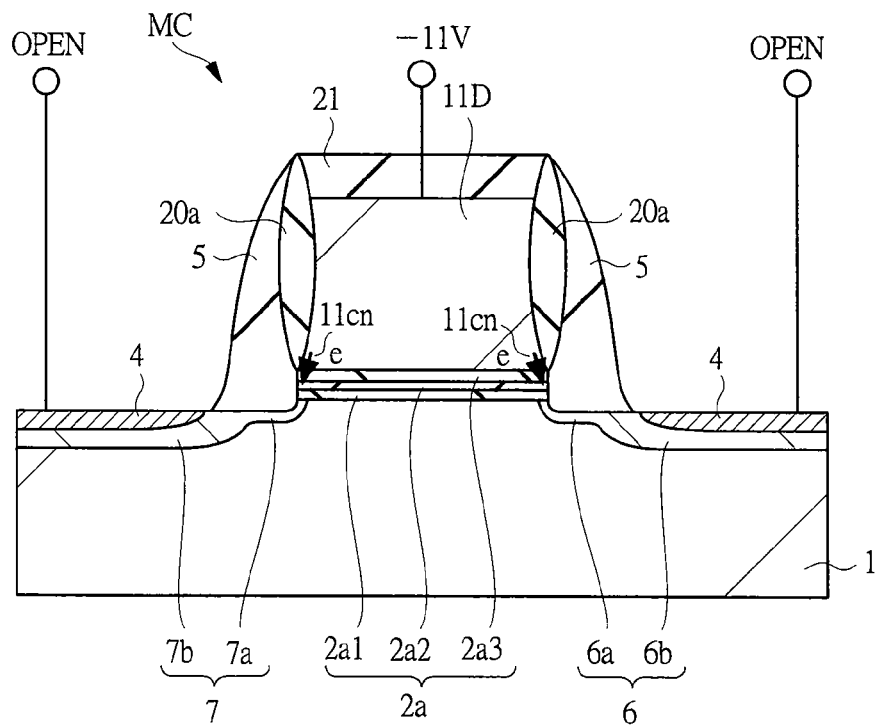
FIG. 43 is a sectional view of the main portion of the semiconductor substrate showing an operating state at the time of erase in the semiconductor device according to the seventh embodiment.

In erase, as shown in FIG. 43, the memory gate electrode 11D is applied with a voltage of, for example, −11 V. Electrons e are injected into the dielectric film 2a2 (the main charge trap film) of the gate dielectric 2a (ONO film) from the acute corner portions 11cn at both ends of the memory gate electrode 11D in the widthwise direction (short side direction), and therefore the threshold voltage is raised and the erase is conducted.

At a read operation, status is determined based upon a value of current flowing the memory cell MC when the memory gate electrode 11D is applied with a voltage of, for example, −5 V, and the drain (doped region 7) is applied with a voltage of, for example, −3 V.

As the doped regions 6 and 7 at both sides of the memory cell MC with this structure are symmetrical, holes can be injected into an opposite end portion of the memory gate electrode 11D by replacing a combination of applied voltages to doped region at the write operation. When a combination of applied voltages to doped region at the read operation is reversed, charge information stored at both widthwise direction (short side direction) ends of the memory gate electrode 11D can be independently read out, so that 2 bit information can be stored in one memory cell MC. At a erase operation, electrons e are injected into the both ends of the memory gate electrode 11D in the widthwise direction, and the stored holes are cancelled simultaneously with the electrons.

A merit of the single gate structure lies in that the number of process steps can be reduced due to its simple structure and a recording density can be improved inexpensively since 2 bit information can be stored in one cell. When a charge injection method using local electric field concentration of the semiconductor device according to the seventh embodiment is applied to this structure, the following effect can be achieved.

First, current consumption at the erase operation can be reduced as compared with the method using the conventional BTBT erase.

Second, a steep junction at the doped regions 6 and 7 for achieving high efficiency of BTBT generation is not required, so that disturb can be suppressed by optimization in junction conditions in which an electric field is relaxed.

Third, the method according to the embodiment using local electric field concentration has such a merit that electric field averagely acting on the top side oxide film (dielectric film 2a3) can be lowered as compared with the method for conducting erase by the whole area injection with Fowler-Nordheim tunneling instead of BTBT erase. Therefore, when the same oxide film thickness is used, erase operation is conducted with a lower voltage, so that a circuit area can be reduced, and when the same operation voltage is utilized, the oxide film thickness is made thicker, so that retention characteristic can be improved.

Eighth Embodiment

An eighth embodiment is a modification example of the first embodiment, where the dielectric film 2a2 (silicon nitride, Si$_3$N$_4$ film) in the gate dielectric (ONO film) 2a trapping charges is replaced by, for example, alumina ($Al_2O_3$ film). The other structure and operation are the same as those of the first and second embodiments.

The alumina film is formed by utilizing, for example, sputtering or ALD (Atomic Layer Deposition or ALCVD (Atomic Layer CVD)). Here, after the dielectric film 2a1 is formed on the main surface of the semiconductor substrate 1, an alumina film with a thickness of 9 nm is formed by, for example, ALD. Thereafter, a memory cell MC is formed according to the same procedure used in the first embodiment.

The feature of the alumina film lies in that fixed charge polarity in the film is negative charge opposite to charge in the silicon nitride and a threshold voltage is shifted to the plus side. In the memory cell MC of PMOS type, since a positive shift of the threshold voltage is a direction in which ON current increases, the alumina film is suitable for high-speed operation. Since the dose amount of counter ion implantation for raising the threshold voltage can be reduced, sub-threshold characteristic of the memory cell MC is improved. Especially, the alumina film is suitable for a case where the memory gate voltage and the voltage on the semiconductor substrate are set to be equal to each other at the read operation by the method explained in the second embodiment and an effective external electric field does not act on the retention film, which improves retention characteristic. In this case, since it is necessary to raise the threshold voltage of the memory cell MC above an ordinary voltage, application of the alumina film is preferable.

Ninth Embodiment

A ninth embodiment is a modification example of the first embodiment, where the dielectric film 2a2 (silicon nitride, $Si_3N_4$ film) in the gate dielectric (ONO film) 2a trapping charges is replaced by, for example, silicon oxynitride (SiON film). The other structure and operation are the same as those of the first and second embodiments.

Here, after the dielectric film 2a1 is formed on the main surface of the semiconductor substrate 1, silicon oxynitride with a thickness of 7 nm is formed with, for example, CVD. Thereafter, a memory cell MC is formed according to the same procedure used in the first embodiment.

The silicon oxynitride has a deep trap level trapping charges and it is difficult for trapped charges to escape, so that retention characteristic can be improved.

Tenth Embodiment

A tenth embodiment is a modification example of the first embodiment, where the dielectric film 2a2 (silicon nitride, $Si_3N_4$ film) in the gate dielectric (ONO film) 2a trapping charges is replaced by, for example, silicon nanocrystal.

Figure 44:
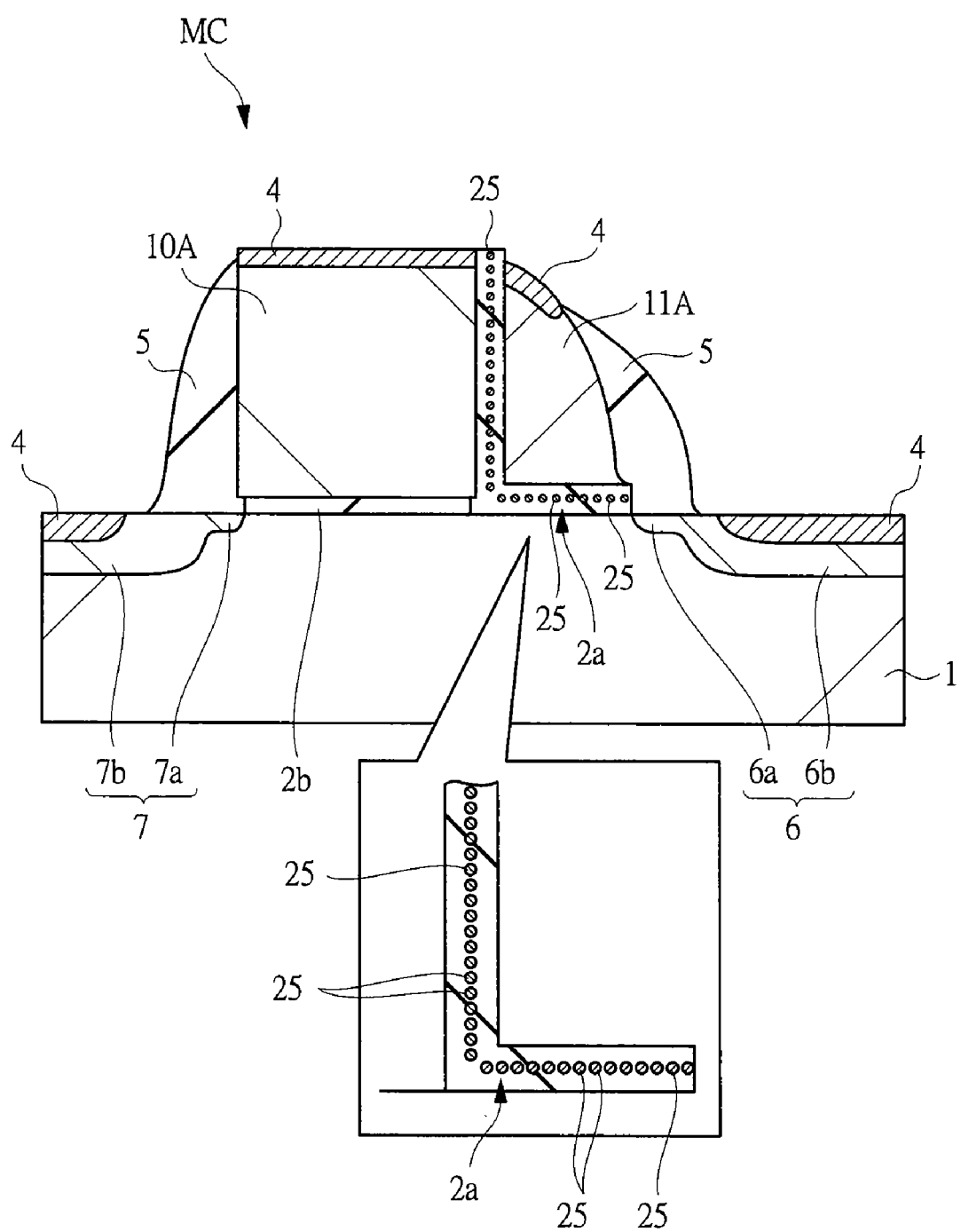
FIG. 44 is a sectional view of a memory cell in a semiconductor device according to another embodiment (tenth embodiment) of the present invention.

As shown in FIG. 44, the silicon nanocrystal is dispersed in the gate dielectric 2a, especially in this embodiment, in a single film composed of silicon oxide ($SiO_2$ film), as fine particles 25 with a diameter of 3 to 6 nm which is smaller than a film thickness of the silicon oxide. However, a layer of the particles 25 of silicon nanocrystal is sandwiched in the silicon oxide.

The structure of the tenth embodiment can be regarded as a structure containing many fine floating gate electrodes in which charges are discretely trapped in the particles 25 of silicon nanocrystal enclosed by the silicon oxide ($SiO_2$ film) serving as a potential barrier. Whereby, the structure is provided with stable property to a defect in the silicon oxide ($SiO_2$ film), so that such a problem in a conventional floating gate electrode can be overcome that there is a possibility that all charges are lost even when only one defect occurs.

In the structure of the tenth embodiment, since the particles 25 of silicon nanocrystal are insulated from one another, which is different from the case of the floating electrode structure, it is necessary to cause injection distributions of charges with reverse polarity used in write and erase to have the same distribution, but charges can be injected into the same portion by using the system of the embodiment, so that (program and erase) endurance can be improved.

As a modification example of the structure of the tenth embodiment, such a structure can be adopted that a stacked film (namely, ONO film) of dielectric films 2a1, 2a2, and 2a3 is used as the gate dielectric 2a instead of a single film of the silicon oxide ($SiO_2$ film) and the particles 25 of silicon nanocrystal are dispersed in the dielectric film 2a2 ($Si_3N_4$ film) sandwiched between the upper and lower dielectric films 2a1 and 2a3. In this case, since charges contributing to storage of information is trapped not only in the particles 25 of silicon nanocrystal but also in the dielectric film 2a2 ($Si_3N_4$ film), retention characteristic can be improved.

Eleventh Embodiment

An eleventh embodiment is a modification example of the first embodiment, where the gate dielectric (ONO film) 2a trapping charges has been changed from a three-layered structure of the dielectric films 2a1, 2a2, and 2a3 to a two-layered structure of dielectric films 2a1 and 2a2.

Figure 45:
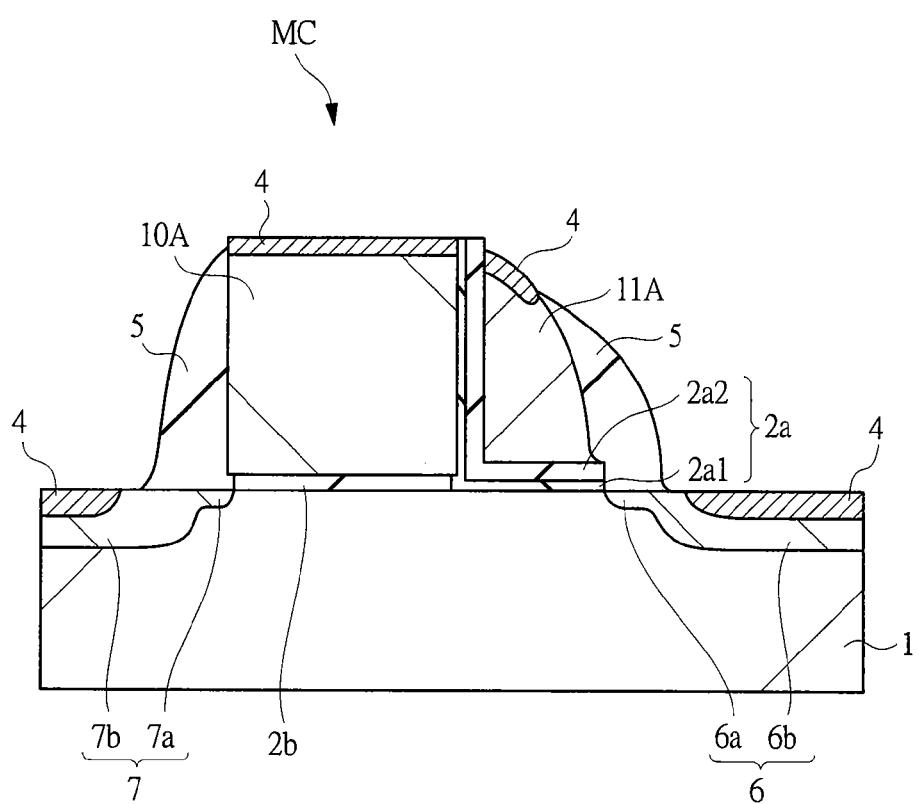
FIG. 45 is a sectional view of a memory cell in a semiconductor device according to another embodiment (eleventh embodiment) of the present invention.

FIG. 45 shows one example of a sectional view of a memory cell MC of a semiconductor device according to the eleventh embodiment. Here, in the gate dielectric 2a, a film thickness of the dielectric film 2a1 on the semiconductor substrate 1 side is the same as that of the first embodiment, for example, 4 nm, and a film thickness of the dielectric film 2a2 as an upper layer thereof is, for example, 20 nm.

According to the eleventh embodiment, by removing the oxide film (the top oxide film, the dielectric film 2a3) at the memory gate electrode 11A side, a barrier to injection charges become low, so that electron injection at the time of erase can be conducted at a high speed and a low voltage.

In order to compensate for influence where charges in the dielectric film 2a2 serving as the main charge trap film easily escape, a film thickness of the dielectric film 2a2 is made thicker, such as 20 nm, than that of the first embodiment. However, the retention characteristic at a high temperature tends to lower. The structure of the eleventh embodiment is one of choices according to a targeted specification considering a temperature range and a merit of a circuit area reduction owing to speeding-up/voltage lowering at the erase operation. In order to improve the retention characteristic, the structure may be combined with a method of replacing the silicon nitride serving as the dielectric film 2a2 to an alumina film ($Al_2O_3$ film) or silicon oxynitride (SiON film). Especially, the silicon oxynitride (SiON film) has a merit in which holes can be easily injected.

Twelfth Embodiment

A twelfth embodiment has such a structure that conductive types of respective portions in the memory region (including the memory gate electrode and the select gate electrode) have polarities opposite to those of the first embodiment. A physical shape in the twelfth embodiment is equal to that of FIG. 22 of the first embodiment.

The memory region in the twelfth embodiment includes, on a p type semiconductor substrate 1, a p type well formed by ion-implantation of, for example, boron which is p type dopant, lightly doped regions 6a and 7a for extension obtained by ion-implantation of, for example, arsenic which is n type dopant, highly doped regions 6b and 7b, a select gate electrode 10A obtained by ion-implantation of, for example, phosphorus which is n type dopant, and a p$^+$ type memory gate electrode 11A highly doped with, for example, boron which is p type dopant. In ion implantation for threshold voltage adjustment in the channel portion, for example, boron is ion-implanted into the whole channel, and arsenic, as counter ion implantation, is implanted into the memory gate electrode 11A by an amount which is more than the required amount for canceling the implanted boron. The other ion-implantations are performed in the same manner of the first embodiment.

Next, an operating method of the memory cell MC in the semiconductor device according to the twelfth embodiment will be explained. In write operation, electrons are injected by using source-side injection (SSI). Because of NMOS type memory cell MC, the same operating system as the conventional one is used in write. The drain (doped region 7) is controlled such that a value of current flowing in the memory cell MC is, for example, 2 μA/bit by applying, for example, respectively, 9 V and 5 V to the memory gate electrode 11A and the source (doped region 6), and applying, for example, 1 V to the select gate electrode 10A to cause weak inversion. At this time, the absolute value of the drain potential becomes, for example, approximately 0.4 V. Flowing electrons are accelerated by the electric field between the select gate electrode 10A and the memory gate electrode 11A to generate hot electrons, and the hot electrons are injected into the gate dielectric 2a (ONO film) of the memory gate electrode 11A. Whereby, the threshold voltage rises so that a write state is obtained.

In an operation at the time of erase, for example, a positive voltage of 12 V is applied to only the memory gate electrode 11A, the source (doped region 6) and the drain (doped region 7) are opened, and the select gate electrode 10A and the semiconductor substrate 1 are set to, for example, 0 V (grounded). An electric field concentrates at the corner portion 11cn of the memory gate electrode 11A, and holes are injected into the gate dielectric 2a (ONO film) because of the p+ type gate electrode. Whereby, the absolute value of the threshold voltage lowers, so that an erase operation is performed. Owing to Fowler-Nordheim tunneling erase from the corner portion 11cn, current consumption at the time of erase is reduced, so that an area of the memory module including a power supply circuit can be reduced.

At the read operation, status determination is made based upon a current flowing in the memory cell MC when a voltage of, for example, 1 V is applied to the drain (doped region 7), a voltage of, for example, 1.5 V is applied to the select gate electrode 10A, and a voltage of, for example, 1.5 V is applied to the memory gate electrode 11A. A list of operation voltage conditions is shown in FIG. 46. Since the NMOS structure is used in this system, a large memory cell current value can be taken, so that the structure of the twelfth embodiment is suitable for high-speed read operation application.

Thirteenth Embodiment

In a thirteenth embodiment, the conductive type of the memory gate electrode is set to n$^+$ type which is a reverse polarity to that of the above-mentioned twelfth embodiment.

After a gate dielectric 2a (ONO film) under the memory gate electrode 11A is formed, for example, polysilicon film which is not doped with dopant is formed, and n$^+$ type gate electrode (memory gate electrode 11A) is formed by ion implantation of, for example, phosphorus in an amount of 2×10$^{15}$ atoms/cm$^2$. The other process of the forming method of the memory cell MC is the same as that of the twelfth embodiment. The n$^+$ type gate electrode may be formed with polysilicon doped with phosphorus being dopant in advance.

An operating method of the memory cell MC of the semiconductor device according to the thirteenth embodiment is as follows.

The write operation and the read operation are the same as those of the twelfth embodiment.

In the erase operation, a voltage applied to the memory gate electrode 11A is set to be as high as, for example, 14 V. By doing this, a portion of the memory gate electrode 11A (n$^+$ type gate electrode) contacting with the gate dielectric 2a (ONO film) be depleted and holes accelerated by an electric field acting on the depletion layer is injected into the gate dielectric 2a (ONO film), so that the threshold voltage lowers and erase is performed. When the dopant concentration is too high, depletion is difficult to occur, so that an implantation amount of phosphorus or the like into the n+ gate electrode (memory gate electrode 11A) is lower than an ordinary implantation amount to manufacture the n+ gate electrode.

In this system, an application voltage to the memory gate electrode 11A becomes high, but a combination of the n$^+$ type memory gate electrode 11A and the n type doped regions 6 and 7 which are the same as those of the ordinary nMOS is adopted. Therefore, there is a merit that it is unnecessary to relax the conditions of ion implantation into the doped regions 6 and 7 and flexibility of tuning for scaling and characteristic improvement of the memory cell MC is increased. Further, since the structure of the thirteenth embodiment is the nMOS type similar to the twelfth embodiment, read current is large, thereby being suitable for speeding up.

Fourteenth Embodiment

In a fourteenth embodiment, a conductive type of the memory gate electrode is set to P$^+$ type which is a reverse polarity to that of the above-mentioned first embodiment.

Here, for example, polysilicon film which is not doped with dopant is formed and a p+ type gate electrode (memory gate electrode 11A) is formed by ion implantation of, for example, boron in an amount of 5×10$^{14}$ atoms/cm$^2$. The other process of the forming method of the memory cell MC is the same as that of the first embodiment. As the p+ type gate electrode (memory gate electrode 11A), polysilicon doped with dopant such as phosphorus in advance may be formed.

An operating method of the memory cell MC of the semiconductor device according to the fourteenth embodiment is as follows.

The write operation and the read operation are the same as those of the first embodiment.

In the erase operation, a voltage applied to the memory gate electrode 11A is set to be as high as, for example, −14 V. By doing this, a portion of the memory gate electrode 11A (p$^+$ type gate electrode) contacting with the gate dielectric 2a (ONO film) is depleted and holes accelerated by an electric field acting on the depletion layer is injected into the gate dielectric 2a (ONO film), so that the threshold voltage rises and the erase is performed.

In this system, an application voltage to the memory gate electrode 11A becomes high, but a combination of the p$^+$ type memory gate electrode 11A and the p type doped regions 6 and 7 which are the same as those of the ordinary PMOS is adopted. Therefore, there is a merit that it is unnecessary to relax the conditions of ion implantation into the doped regions 6 and 7 and flexibility of tuning for scaling and characteristic improvement of the memory cell MC is increased.

Fifteenth Embodiment

In a fifteenth embodiment, a hybrid erasing system for conducting the band to band tunneling erase after Fowler-Nordheim tunneling erasing with local electric field concentration is performed, which is different from the first embodiment.

A combination with an erase voltage is shown in FIG. 47. As a first stage of erase (erase 1), the threshold voltage of the written memory cell MC is erased up to 75% of the threshold voltage of a target erasing level by applying a voltage of, for example, −11 V to the memory gate electrode 11A as with the first embodiment. Thereafter, the erasing method is switched to a band to band tunneling erase method (erase 2) and performed, and erase up to the target erase level is performed by applying a voltage of, for example, 6 V to the memory gate electrode 11A and, for example, −6 V to the source (highly doped region 6).

In this system, since the band to band tunneling erase is performed, the problems of the erase current and the disturb resistance are not completely solved, but an area reduction of the power supply circuit to a certain extent can be possible. Both a merit of circuit area reduction due to Fowler-Nordheim tunneling and a merit of realization of a deep erase level caused by high energy charges by using hot carriers generated in band to band tunneling are taken in. As a result, a read current increases, and this system is suitable for high speed operation for high-end and can be realized at a low cost. (Program and erase) endurance can be improved by such an effect that an injection distribution of charges for erase approaches a distribution of charges for write.

As described above, a method for manufacturing a non-volatile memory of a charge trap film type which reduces current consumption at the time of erase by an erase method in which charges are injected from the corner portion 11cn of the memory gate electrode 11A by utilizing Fowler-Nordheim tunneling and reduces the circuit area, and an operating method thereof have been described. Incidentally, it goes without saying that an expected effect can be obtained even in the above-mentioned simple combination.

As explained above, according to the embodiment, since current consumption at erase operation can be reduced by using Fowler-Nordheim tunneling utilizing local electric field concentration structure for erase, a power source circuit area of a memory module can be reduced.

Regarding the memory cell itself, when the erase method according to the embodiment is adopted, write disturb resistance can be improved, so that a memory array area can be reduced by adopting a simpler memory array configuration. Accordingly, an area of the memory module can be reduced largely according to both reduction of the memory array area and reduction of the power supply circuit area, so that manufacturing cost of a semiconductor device can be reduced.

Here, the reason why the erase method of the embodiment improves write disturb resistance and simplifies a memory array configuration will be explained more specifically.

The write disturb names, in general, incorrect write into memory cells MC other than the memory cell MC in which write is being conducted. The write disturb occurs at memory cells MC sharing a word line and source line in the vicinity of the memory cell MC in which write is being conducted, and there are several modes depending on the memory array configuration or the bias state. Though respective modes are not described in detail, an amount of charges to be injected increases according to increase of intensity of an electric field near a channel, so that incorrect write easily occurs. Therefore, it is generally effective to relax doped region profile in order to weaken the electric field.

Figure 48:
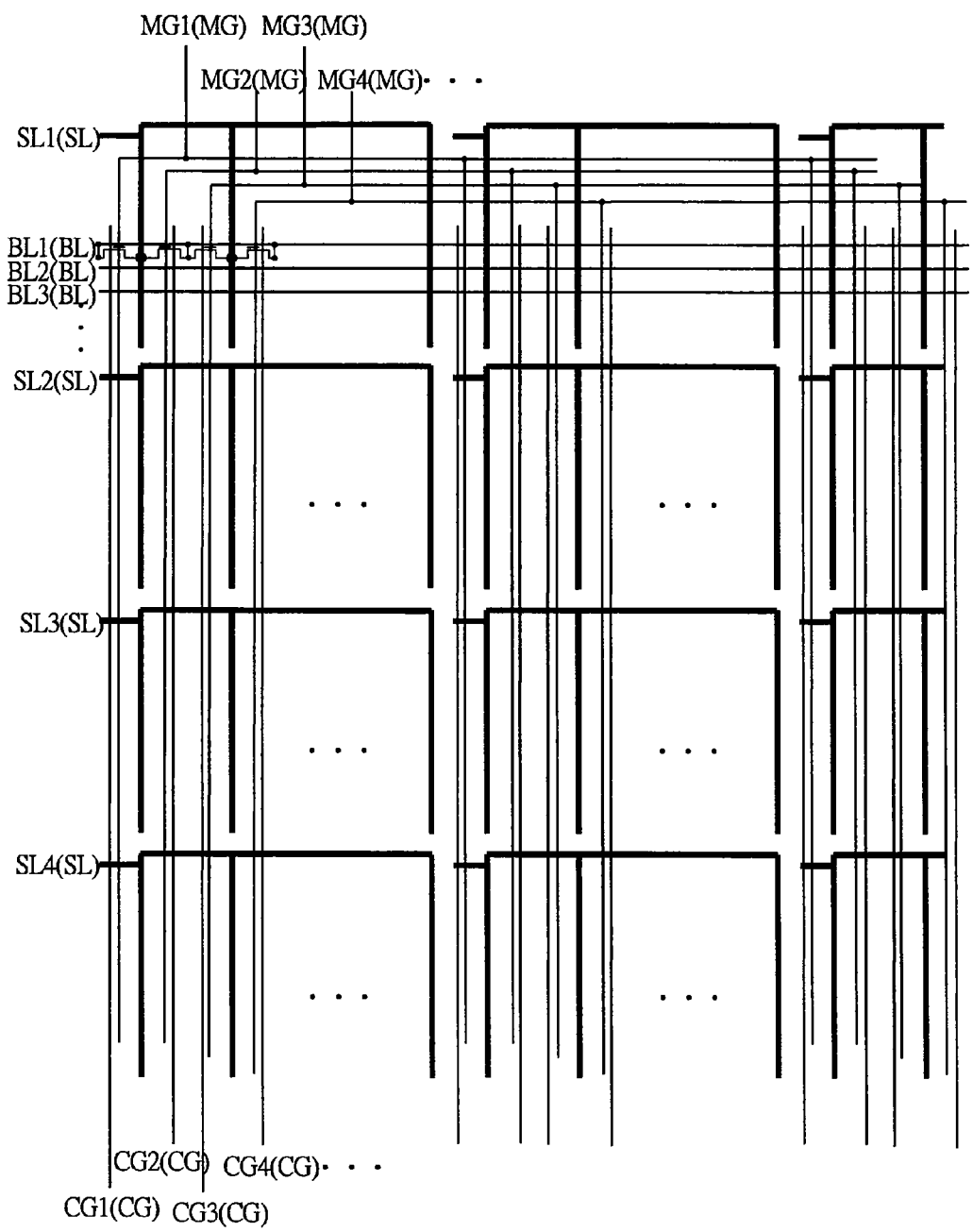
FIG. 48 is a circuit diagram showing a configuration example of a memory array of a semiconductor device examined by the present inventors.

However, as described in the embodiment, since the band to band tunneling (BTBT) is used for erase, each dopant profile of the doped regions 6 and 7 is required to be steep to a certain extent or more, and the dopant profile has a tradeoff relationship with the disturb resistance. Therefore, measures to the disturb, which does not modify the doped regions 6 and 7, are taken. Specifically, a memory array configuration is made to be complicated so as to reduce the number of memory cells on which write select voltage is applied. In this case, a configuration example of a memory array is shown in FIG. 48.

Word lines (direction in which memory gate lines MG (MG1, MG2, MG3, MG4 . . . ), select gate lines CG (CG1, CG2, CG3, CG3 . . . ), and source lines SL (SL1, SL2, SL3, SL4 . . . ) extend) are shown in a vertical direction, and bit lines BL (BL1, BL2, BL3 . . . ) are shown in a horizontal direction. As the measures to disturb, a measure in which memory gate lines MG are bundled for each eight lines such that the same bias is not applied to adjacent memory gate lines MG is adopted. Further, regarding the source lines SL, such a measure in which 2 k bits of one word line is divided to four pieces and simultaneously time period of bias application is shorten is adopted. As a result, an area of a switch portion controlling the memory gate line MG and the source line SL increases, which results in increase of an area as a memory array.

Figure 49:
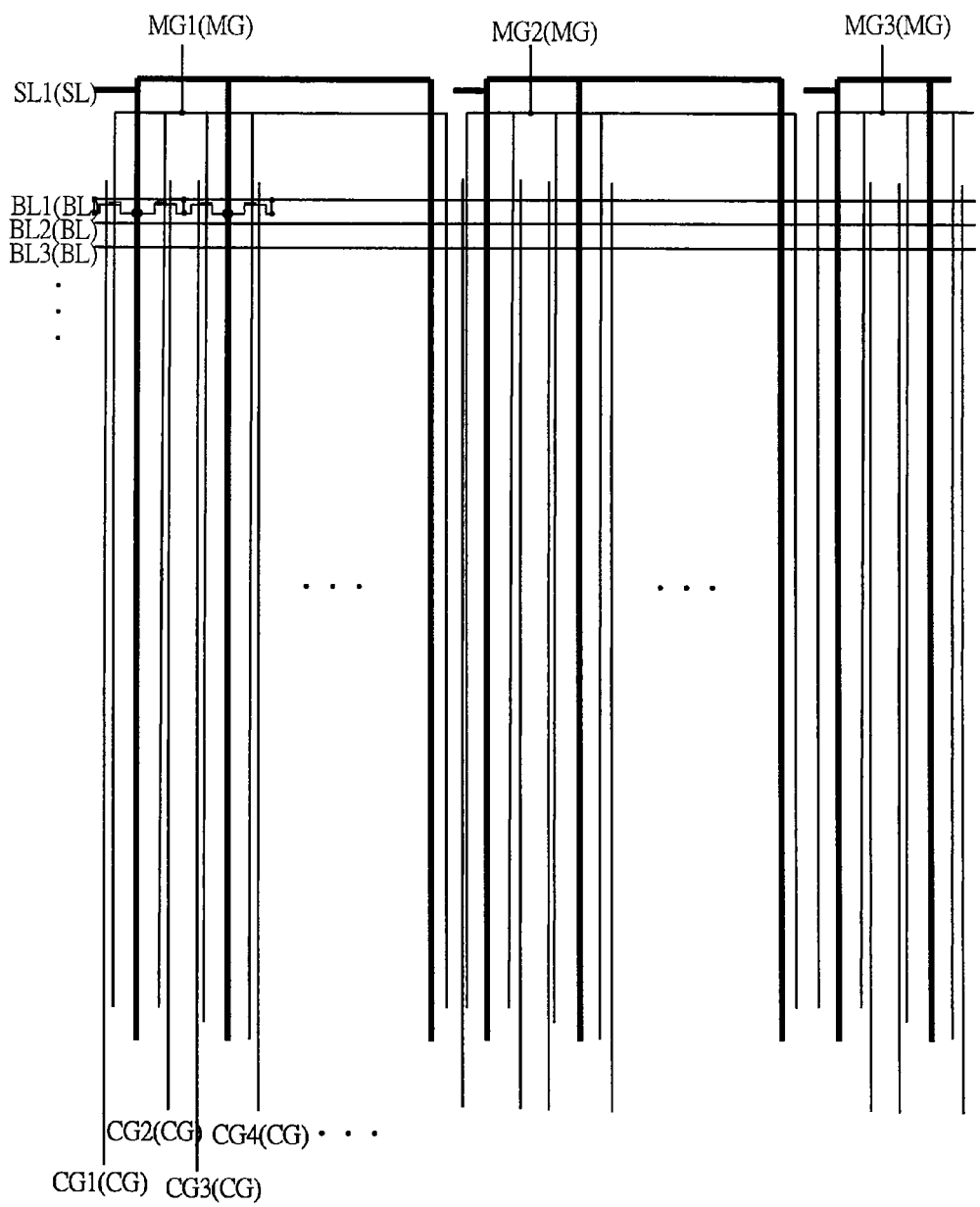
FIG. 49 is a circuit diagram showing a configuration example of a memory array of a semiconductor device according to an embodiment of the present invention.

On the contrary, since characteristic of the Fowler-Nordheim tunneling erase according to the embodiment is independent of a dopant profile of the doped regions 6 and 7, the dopant profile of the doped regions 6 and 7 can be optimized to a relaxed profile improving the disturb resistance. As a result, as shown in FIG. 49, neighboring memory gate lines MG (MG1, MG2, MG3 . . . ) and the source line SL (SL1) can be bundled, which leads to simplification of the memory array configuration and reduction of an area. In the memory array configuration in this case, structures of the memory gate line MG and the source line SL are simpler than the structure shown in FIG. 48.

There is another reason why the source line SL can be simplified as shown in FIG. 49. In the band to band tunneling erase, an erase current reaches several microns μA/cell and the number of simultaneous erase bits is limited in view of balance with a power supply capacity. Since all memory cells MC on the same source line SL is simultaneously erased in principle, the source line SL must be divided to four pieces so as to conform to the maximum erase bit number in the example shown in FIG. 48. In the embodiment, since limitation of the erase current is eliminated by adopting the erase method, a simple structure in which the source line SL is not divided can be realized as shown in FIG. 49.

In the erase method according to the embodiment, since the Fowler-Nordheim tunneling charge injection mechanism does not depend on a temperature, the erase characteristic does not depend on a temperature, too. Accordingly, correction of the erase voltage corresponding to a temperature is not required and a control circuit can be simplified, so that an effect of reducing the number of design steps and the area of a control circuit can be obtained.

The erase according to the embodiment adopts the method of injecting charges locally, and the injection portion at the erase operation is the same portion as that at the write operation. In the SSI injection of the split-gate structure explained in FIG. 24, the vicinity of a gap between the select gate electrode 10A and the memory gate electrode 11A is an injection center for write charges. And a doped region end portion is a charge injection center for write charges in the NROM structure explained in FIG. 42. Incidentally, charges for erase are also injected in the same portion in this method. Therefore, degradation of (program and erase) endurance due to deviation of an injection charge distribution which is a problem common to the charge trap film and the nonvolatile memory using the local injection does not occur, so that the (program and erase) endurance can be improved.

Further, a feature of the erase method according to the embodiment lies in that charges with opposite polarities which are holes and electrons are used for write and erase while using the Fowler-Nordheim tunneling. In a memory of MONOS type using a film trapping charges such as a $Si_3N_4$ film, write and erase are generally realized by utilizing injection and extraction of charges with the same polarity, for example, electrons, but there is such a drawback that it is difficult to conduct sufficient extraction of charges with the Fowler-Nordheim tunneling in the MONOS type memory and an operation window becomes narrow. On the other hand, since the embodiment uses charge injection with an opposite polarity, it can take a large operation window. Specifically, such an effect that erase can be performed up to a sufficient depth can be obtained.

In the above, the features of "erase" with the Fowler-Nordheim tunneling using the local electric field concentration has been collectively described, but even if the Fowler-Nordheim tunneling operation is defined as "write", it goes without saying that a similar effect can be obtained. The effects common to the embodiments have been collectively described here, but an effect unique to each embodiment has been described in an individual explanation about each embodiment.

In the foregoing, the invention which has been made by the inventors has been explained specifically based upon the embodiments. However, it is needless to say that the present invention is not limited to the foregoing embodiments and it can be modified variously without departing from the gist of the present invention.

In the above descriptions, the case that the invention which has been made by the inventors has been applied to a semiconductor device having a logic operation circuit and a nonvolatile memory circuit arranged on the same semiconductor substrate in an utilization field which is the background of the present invention has been explained, but the present invention is not limited to the case and it can be applied variously, for example, it can be applied to a nonvolatile semiconductor storage device having only a nonvolatile memory circuit.

The present invention can be applied to a manufacturing industry of a semiconductor device having a nonvolatile memory cell including a charge trap film in a gate dielectric.

What is claimed is:

1. A semiconductor device comprising a nonvolatile memory cell, the nonvolatile memory cell including:
   a semiconductor substrate;
   a first gate dielectric provided over a main surface of the semiconductor substrate;
   a charge trap film provided in the first gate dielectric; and
   a memory gate electrode provided over the first gate dielectric,
   wherein an erase operation of the nonvolatile memory cell is performed such that charges having a first polarity are injected into a corner portion of the charge trap film from a corner portion of the memory gate electrode,
   wherein a write operation of the nonvolatile memory cell is performed such that charges having a second polarity opposite the first polarity are injected into the corner portion of the charge trap film from the semiconductor substrate, and
   wherein injecting positions of the charges to the charge trap film in the erase and write operations overlap.

2. The semiconductor device according to claim 1,
   wherein a gate electrode is provided over the main surface of the semiconductor substrate via a second gate dielectric, and
   wherein the memory gate electrode has a side-wall configuration provided on a side of a side wall of the gate electrode.

3. The semiconductor device according to claim 2, wherein the corner portion of the memory gate electrode has an acute angle portion whose angle is smaller than 90°.

4. The semiconductor device according to claim 1,
   wherein the memory gate electrode includes silicon, and
   the corner portion of the memory gate electrode is formed so as to have an acute angle portion whose angle is smaller than 90° by oxidizing a side wall of the memory gate electrode.

5. The semiconductor device according to claim 1,
   wherein the semiconductor substrate has an n type semiconductor region,
   wherein the memory gate electrode includes n type silicon,
   wherein holes are injected from the n type semiconductor region of the semiconductor substrate to the charge trap film, and
   wherein electrons are injected from the memory gate electrode to the charge trap film.

6. The semiconductor device according to claim 5, wherein, when electrons are injected from the memory gate electrode to the charge trap film, a negative potential is applied to the memory gate electrode so that an absolute value of an electric field applied to the first gate dielectric including the charge trap film is in a range of 7 MV/cm or more to 11 MV/cm or less.

7. The semiconductor device according to claim 1,
   wherein the semiconductor substrate has a p type semiconductor region,
   wherein the memory gate electrode includes p type silicon,
   wherein electrons are injected from the p type semiconductor region of the semiconductor substrate to the charge trap film, and
   wherein holes are injected from the memory gate electrode to the charge trap film.

8. The semiconductor device according to claim 7, wherein, when holes are injected from the memory gate electrode to the charge trap film, a positive potential is applied to the memory gate electrode so that an absolute value of an electric field applied to the first gate dielectric including the charge trap film is in a range of 7 MV/cm or more to 11 MV/cm or less.

9. The semiconductor device according to claim 1,
   wherein the semiconductor substrate has a p type semiconductor region,
   wherein the memory gate electrode includes n type silicon,
   wherein electrons are injected from the p type semiconductor region of the semiconductor substrate to the charge trap film, and
   wherein holes are injected from the memory gate electrode to the charge trap film.

10. The semiconductor device according to claim 1,
    wherein the semiconductor substrate has an n type semiconductor region, wherein the memory gate electrode includes p type silicon, wherein holes are injected from the n type semiconductor region of the semiconductor substrate to the charge trap film, and wherein electrons are injected from the memory gate electrode to the charge trap film.

11. The semiconductor device according to claim 1, wherein the charge trap film includes silicon nitride.

12. The semiconductor device according to claim 1, wherein the charge trap film includes aluminum oxide.

13. The semiconductor device according to claim 1, wherein the charge trap film includes silicon oxynitride.

14. The semiconductor device according to claim 1, wherein the charge trap film includes a dielectric film containing silicon nanocrystals each having a diameter smaller than a film thickness of the dielectric film.

15. The semiconductor device according to claim 1, wherein the first gate dielectric has a stacked configuration in which silicon oxide, a charge trap film, and silicon oxide are stacked in this order.

16. The semiconductor device according to claim 1, wherein the first gate dielectric has a stacked configuration in which silicon oxide and a charge trap film are stacked from a main surface side of the semiconductor substrate in this order.

* * * * *